(12) United States Patent
Naemura et al.

(10) Patent No.: US 10,498,060 B2
(45) Date of Patent: Dec. 3, 2019

(54) SUBSTRATE CONNECTION STRUCTURE

(71) Applicant: J.S.T. Mfg. Co., Ltd., Osaka-shi (JP)

(72) Inventors: Ryo Naemura, Osaka (JP); Takahiro Yoshii, Osaka (JP)

(73) Assignee: J.S.T. MFG. CO., LTD., Osaka-shi (JP)

( * ) Notice: Subject to any disclaimer, the term of this patent is extended or adjusted under 35 U.S.C. 154(b) by 0 days.

(21) Appl. No.: 15/754,166

(22) PCT Filed: Aug. 31, 2016

(86) PCT No.: PCT/JP2016/075508
§ 371 (c)(1),
(2) Date: Feb. 21, 2018

(87) PCT Pub. No.: WO2017/038877
PCT Pub. Date: Mar. 9, 2017

(65) Prior Publication Data
US 2019/0013607 A1  Jan. 10, 2019

(30) Foreign Application Priority Data

Aug. 31, 2015  (JP) .................................. 2015-171345
May 9, 2016  (JP) .................................. 2016-093774

(51) Int. Cl.
*H01R 13/62* (2006.01)
*H01R 12/79* (2011.01)
(Continued)

(52) U.S. Cl.
CPC ............. *H01R 12/79* (2013.01); *F21K 9/238* (2016.08); *H01R 12/7076* (2013.01);
(Continued)

(58) Field of Classification Search
CPC ......... H01R 12/79; H01R 12/88; F21K 9/238; H05K 1/189; H05K 2201/10106; F21Y 2115/10
(Continued)

(56) References Cited

U.S. PATENT DOCUMENTS 6,293,818 B1  9/2001  Kim
6,431,897 B1  8/2002  Hashiguchi
(Continued)

FOREIGN PATENT DOCUMENTS

JP  2000-195595 A  7/2000
JP  2001-110483 A  4/2001
(Continued)

OTHER PUBLICATIONS

International Search Report for International Application No. PCT/JP2016/075508 dated Nov. 29, 2016 (2 Sheets).
(Continued)

*Primary Examiner* — Abdullah A Riyami
*Assistant Examiner* — Vladimir Imas
(74) *Attorney, Agent, or Firm* — Kratz, Quintos & Hanson, LLP

(57) ABSTRACT

A substrate connection structure that enables a reduction in thickness is provided. An electrical connector (11) of a connector unit (2) has a housing (22) fixed to an LED substrate (10), contacts (21), and reinforcement tabs (23). The housing (22) includes a bottom wall main body (36) arranged in periphery of a notch portion (18) of the LED substrate (10), and support portions (37) arranged at end portions of the bottom wall main body (36) in a width direction (X1) and supported by a second surface (16) of the LED substrate (10). The reinforcement tabs (23) each include a first fixing portion (45) fixed to the bottom wall main body (36), an extension portion (46) extending from the first fixing portion (45) so as to move away from the first fixing portion (45) along the width direction (X1), and a second fixing portion (47) formed at a leading end of the extension portion (46), arranged side-by-side with the corresponding support portion (37) in a length direction (Y1), and fixed to the second surface (16) of a mounting portion (19).

1 Claim, 22 Drawing Sheets

(51) Int. Cl.
*F21K 9/238* (2016.01)
*H01R 12/70* (2011.01)
*H01R 12/77* (2011.01)
*H05K 1/18* (2006.01)
*H01R 12/72* (2011.01)
*H05K 1/14* (2006.01)
*H01R 12/88* (2011.01)
*F21Y 115/10* (2016.01)

(52) U.S. Cl.
CPC ......... *H01R 12/721* (2013.01); *H01R 12/771* (2013.01); *H05K 1/147* (2013.01); *H05K 1/189* (2013.01); *F21Y 2115/10* (2016.08); *H01R 12/88* (2013.01); *H05K 1/148* (2013.01); *H05K 2201/09145* (2013.01); *H05K 2201/10106* (2013.01); *H05K 2201/10189* (2013.01); *H05K 2201/10446* (2013.01)

(58) Field of Classification Search
USPC ........................................................ 439/260
See application file for complete search history.

(56) References Cited

U.S. PATENT DOCUMENTS

| | | | | |
|---|---|---|---|---|
| 7,182,610 B2* | 2/2007 | Lin | ...................... | H01R 12/707 |
| | | | | 439/567 |
| 7,435,122 B2* | 10/2008 | Suzuki | .................. | H01R 12/771 |
| | | | | 439/260 |
| 7,572,130 B1* | 8/2009 | Zhang | ................... | H05K 1/182 |
| | | | | 439/79 |
| 7,591,661 B2* | 9/2009 | Suzuki | ................... | H01R 12/79 |
| | | | | 439/260 |
| 7,766,680 B2* | 8/2010 | Suzuki | .................. | H01R 12/88 |
| | | | | 439/260 |
| 7,892,029 B2* | 2/2011 | Wang | .................. | H01R 13/112 |
| | | | | 439/607.32 |
| 8,616,906 B2* | 12/2013 | Iijima | .................... | H01R 12/88 |
| | | | | 439/260 |
| 8,840,411 B2* | 9/2014 | Nakano | .................. | H01R 12/79 |
| | | | | 439/260 |
| 8,858,249 B2* | 10/2014 | Honda | ................. | H01R 13/648 |
| | | | | 439/260 |
| 9,444,166 B2* | 9/2016 | Ohyama | .............. | H01R 12/774 |
| 9,634,410 B2* | 4/2017 | Takane | ................ | H01R 12/716 |
| 10,050,364 B1* | 8/2018 | Morino | .................. | H01R 12/87 |
| 2006/0084311 A1 | 4/2006 | Suzuki | | |
| 2009/0163065 A1 | 6/2009 | Suzuki | | |

FOREIGN PATENT DOCUMENTS

| | | |
|---|---|---|
| JP | 2002-025662 A | 1/2002 |
| JP | 2006-114436 A | 4/2006 |
| JP | 2006-338955 A | 12/2006 |
| JP | 2013-157108 A | 8/2013 |
| JP | 2013-235844 A | 11/2013 |
| JP | 2015-090862 A | 5/2015 |
| WO | 2007039950 A1 | 4/2007 |

OTHER PUBLICATIONS

Notification of Reasons for Refusal dated Dec. 8, 2015 by JPO for counterpart Japanese patent application JP 2015-171345 (2 Sheets).
Notification of Reasons for Refusal dated Mar. 8, 2016 by JPO for counterpart Japanese patent application JP 2015-171345 (3 Sheets).
Decision of Final Rejection dated Jun. 7, 2016 by JPO for counterpart Japanese patent application JP 2015-171345 (2 Sheets).
Decision of Dismissal of Amendment dated Jun. 7, 2016 by JPO for counterpart Japanese patent application JP 2015-171345 (3 Sheets).
Notification of Reasons for Refusal dated Nov. 22, 2016 by JPO for counterpart Japanese patent application JP 2016-093774 (3 Sheets, 3 Sheets translation, 6 Sheets total).
Notification of Reasons for Refusal dated Nov. 22, 2016 by JPO for counterpart Japanese patent application JP 2016-169073 (3 Sheets, 3 Sheets translation, 6 Sheets total).

* cited by examiner

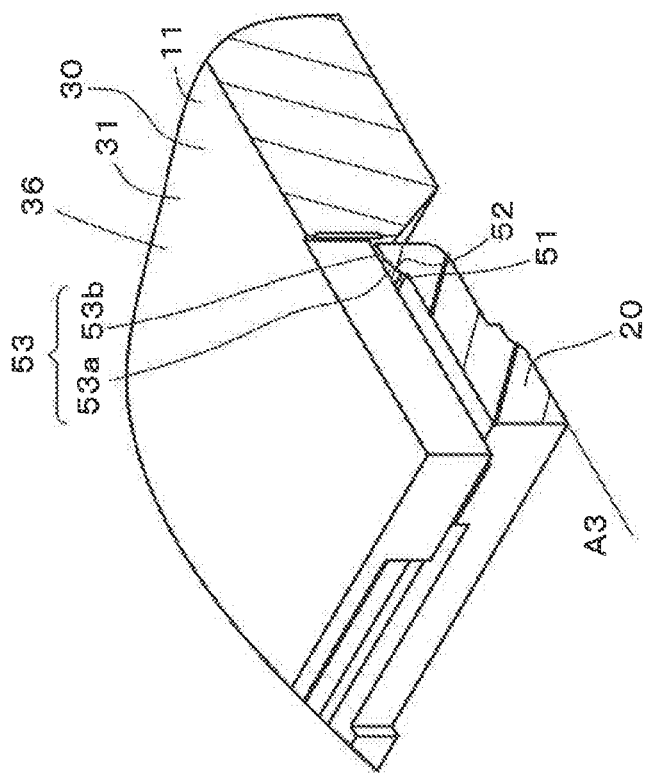
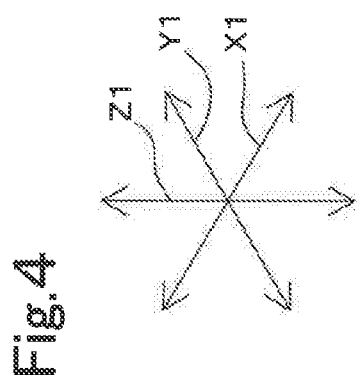

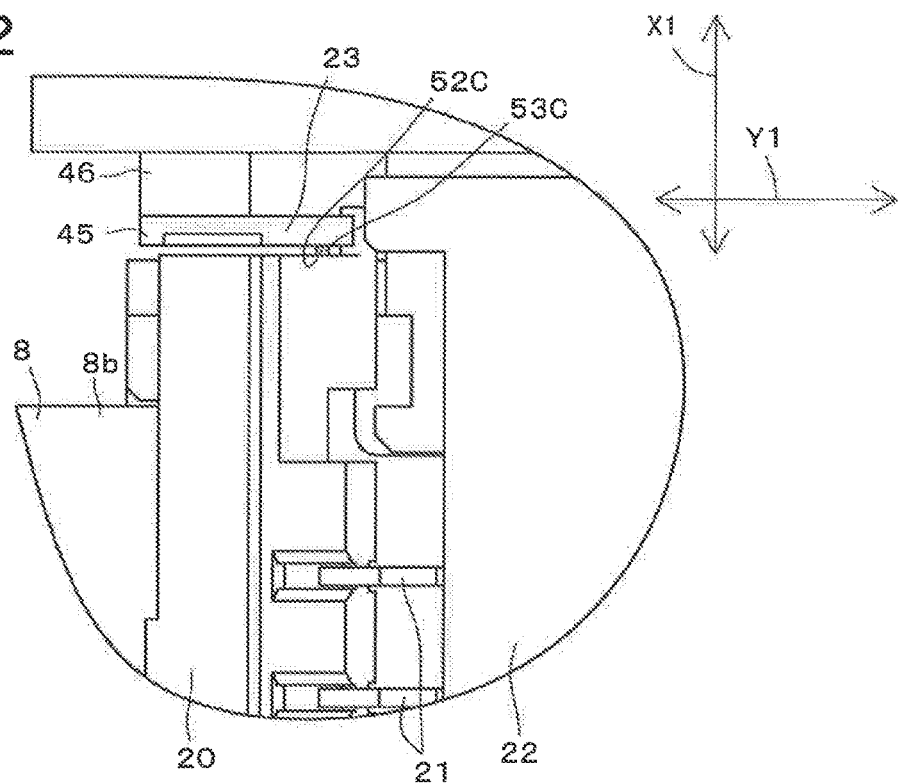
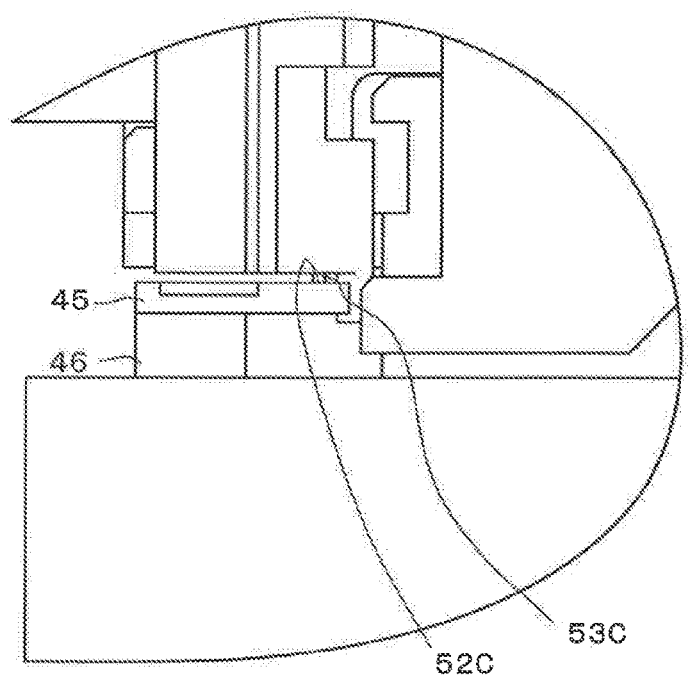
Fig.22

SUBSTRATE CONNECTION STRUCTURE

TECHNICAL FIELD

The present invention relates to a substrate connection structure for connection to a partner connection member such as a flexible printed circuit (FPC) or a flexible flat cable (FFC).

BACKGROUND ART

An electrical connector for connection to an FFC serving as the partner connection member has, for example, a housing, contacts that are held by the housing, and an actuator for maintaining contact between conductive portions of the FFC and the contacts (e.g., see Patent Application Document 1).

The actuator is swingably attached to the housing, and can swing between an open position and a closed position. The FFC is inserted between the housing and the actuator while the actuator is in the open position. When insertion of the FFC is complete, the actuator is displaced to the closed position by being operated by a finger or the like of a worker, and the FFC is locked as a result. Accordingly, the conductive portions of the FFC are in contact with corresponding contacts, and the operation of connecting the FFC and the electrical connector is complete.

In the configuration described in Patent Application Document 1, a protrusion-shaped actuator lock portion is formed on a side portion of the actuator. When the actuator is arranged at the closed position, the actuator lock portion engages with a protrusion-shaped housing lock portion that is formed on the housing. Accordingly, the actuator does not return to the open position even if subjected to an external force such as vibration or impact.

CITATION LIST

Patent Document

Patent Application Document 1: JP 2013-235844 ([0051], FIG. 3)

DISCLOSURE OF THE INVENTION

Problem to be Solved by the Invention

Incidentally, there are cases where an electrical connector is arranged in a space having a small thickness (a narrow space), such as in the casing of a liquid crystal display television. In such a case, there is a demand for a thinner shape for the substrate connection structure that includes the electrical connector and the substrate on which the electrical connector is mounted.

The present invention was achieved in light of the above-described circumstances, and an object of the present invention is to provide a substrate connection structure that enables realizing a reduction in thickness.

Means for Solving the Problem (1) A substrate connection structure according to one aspect of the present invention for achieving the above-described object is a substrate connection structure having a substrate and an electrical connector, the substrate including a notch portion formed in one edge portion of the substrate, and a mounting portion formed in a periphery of the notch portion, the electrical connector being mounted on the mounting portion, the mounting portion having a first surface and a second surface that are parallel to each other, the electrical connector including a housing, a contact held in the housing and capable of coming into contact with a predetermined partner connection member, and a reinforcement tab attached to the housing, the housing including a bottom wall main body arranged in a periphery of the notch portion, and a support portion arranged at an end portion of the bottom wall main body in a width direction of the electrical connector and supported by the second surface, and the reinforcement tab including a first fixing portion fixed to the bottom wall main body, an extension portion extending from the first fixing portion so as to move away from the first fixing portion along the width direction, and a second fixing portion formed at a leading end of the extension portion, arranged side-by-side with the support portion in a length direction orthogonal to the width direction, and fixed to the second surface of the mounting portion.

According to this configuration, the second fixing portion of the reinforcement tab and the support portion of the housing are arranged on the second surface of the substrate. Also, the housing is configured such that the support portion protrudes from the bottom wall main body in the width direction, and therefore the space surrounded by the support portion and the bottom wall main body is a notch-shaped space. Also, the second fixing portion of the reinforcement tab is arranged in this notch-shaped space. Accordingly, the support portion, which is arranged at an end portion of the housing in the width direction and is supported by the substrate, is side-by-side with the second fixing portion in the length direction of the electrical connector. In this way, the support portion of the housing and the second fixing portion of the reinforcement tab are side-by-side in the length direction on one side of the bottom wall main body, and therefore the overall length of the electrical connector in the width direction and the overall thickness of the electrical connector can be made even smaller (thickness reduction can be achieved). As a result, it is possible to achieve a further reduction in the thickness of the substrate connection structure.

(2) Preferably, the electrical connector includes an actuator, the actuator, has a shaft portion enabling swinging relative to the housing, is configured to be displaced to a predetermined open position and a predetermined closed position relative to the housing by swinging about the shaft portion, is configured such that pressure contact of the contact and the partner connection member is canceled by the actuator being arranged at the open position, and is configured such that the contact is brought into pressure contact with the partner connection member by the actuator being arranged at the closed position, and the reinforcement tab includes a hole portion configured to receive the shaft portion and rotatably support the shaft portion.

According to this configuration, the reinforcement tab is used as a member that connects the housing and the substrate and also supports the shaft portion. Accordingly, a hole portion for the shaft portion does not need to be formed in the housing, thus making it possible to further reduce the thickness of the housing, and consequently making it possible to realize a further reduction in the thickness of the substrate connection structure.

(3) Preferably, the first fixing portion is arranged at an end portion of the bottom wall main body in the width direction, and the hole portion is formed in the first fixing portion and is arranged side-by-side with the support portion in the length direction.

According to this configuration, the support portion of the housing, the second fixing portion of the reinforcement tab, and the hole portion of the reinforcement tab are arranged along the length direction. Accordingly, it is possible to further shorten the length of the electrical connector in the width direction.

(4) Preferably, the actuator is arranged on a first surface side of the mounting portion, and the actuator is arranged at a position recessed from the first surface with respect to a thickness direction of the substrate when the actuator is located at the closed position.

According to this configuration, the actuator is arranged at a position recessed from the first surface with respect to the thickness direction of the substrate when the actuator is located at the closed position. Accordingly, the actuator does not protrude from the first surface of the substrate, thus making it possible to achieve a further reduction in the overall thickness of the substrate connection structure that includes the actuator and the substrate.

(5) Preferably, a direction the second surface faces is different from a displacement direction in which the actuator is displaced from the closed position to the open position.

According to this configuration, the direction that is faced by the second surface on which the housing of the electrical connector is implemented is different from the displacement direction in which the actuator is displaced from the closed position to the open position. Accordingly, it is possible to suppress cases where the mounting portion comes into contact with a finger or the like when a worker operates the actuator with a finger or the like, for example. The mounting portion therefore does not become an obstacle when the worker operates the actuator. In other words, it is possible to ensure a larger amount of space for operating the actuator. In this way, by ensuring a larger amount of space for operating the actuator, a worker or the like can more easily operate the actuator even in a case where many parts including the substrate with electrical connector are arranged in a narrow (small) space.

(6) Preferably, a plurality of the contacts are arranged along a predetermined width direction, each of the contacts includes a first contact portion fixed to the second surface, a second contact portion configured to come into contact with a conductive portion of the partner connection member, and a joining portion configured to join the first contact portion and the second contact portion to each other, the joining portion includes a first portion continuous with the first contact portion, and a second portion continuous with the second contact portion, the first portion has a curved shape so as to move away from the second surface while extending from the first contact portion toward the one edge portion of the substrate, and spans an edge portion of the notch portion at a position separated from the second surface, the second portion has an L-shaped bent portion that extends toward the notch portion from another end portion of the first portion on a side opposite to one end portion continuous with the first contact portion, a second portion main body continuous with the bent portion and arranged so as to pass through the notch portion, and an arm portion extending from the second portion main body, and the second contact portion is provided in the arm portion.

According to this configuration, the first portion of the joining portion of the contact is formed with a curved shape between the second contact portion and the first contact portion that is fixed to the substrate. Accordingly, when external force acts on the contact, this curved portion deforms as a spring, and therefore the contact can flexibly handle this external force. Accordingly, it is possible to suppress cases where an excessive force acts between the contact and the substrate. Also, the first portion of the joining portion of the contact spans the edge portion of the notch portion at a location separated from the second surface. Accordingly, it is possible to further increase the distance (creepage distance of insulation) from the conductive layer inside the substrate, which is generally exposed to the edge portion of the notch portion, thus making it possible to more reliably suppress cases where a short occurs between the contact and this conductive layer. Also, the second contact portion of the contact, which is the portion that comes into contact with the partner connection member, is arranged at a location separated from the substrate (in the vicinity of the notch portion). Accordingly, the substrate and the second contact portion are not arranged so as to be overlapped in the thickness direction of the substrate, and as a result, it is possible to reduce the overall length of the contact and the substrate in the thickness direction of the substrate. In other words, it is possible to realize a reduction in the height of the electrical connector relative to the substrate. In this way, it is possible to simultaneously exhibit effects that are difficult to achieve together, namely an increase in the degree of freedom in deformation of the contact, an improvement in insulation performance, and a reduction in the height of the substrate connection structure.

(7) Preferably, the extension portion of the reinforcement tab extends in a curved L shape from the first fixing portion while being separated from the housing.

According to this configuration, the extension portion of the reinforcement tab is formed with a curved L shape while being separated from the housing. Accordingly, when external force acts on the reinforcement tab, this curved portion deforms as a spring, and therefore the reinforcement tab can flexibly handle this external force. Accordingly, it is possible to suppress cases where an excessive force acts on the housing and the contact.

(8) Preferably, the first fixing portion is arranged in the notch portion so as to extend along an edge portion of the notch portion, and the second fixing portion is arranged at an end portion of the housing in the width direction.

According to this configuration, the housing is supported at multiple points on the substrate in a stable orientation by the reinforcement tab and the contact.

Effects of the Invention

According to the present invention, it is possible to provide a substrate connection structure that enables realizing a reduction in thickness.

BRIEF DESCRIPTION OF THE DRAWINGS

FIG. 4 is a perspective view of a partial cross-section of the electrical connector unit.

FIG. 22 is a diagram showing main portions of another variation.

DESCRIPTION OF EMBODIMENTS

Hereinafter, embodiments for carrying out the present invention will be described with reference to the drawings. The present invention is broadly applicable to various applications, as a substrate connection structure, a substrate with electrical connector, and an electrical connector.

Figure 1:
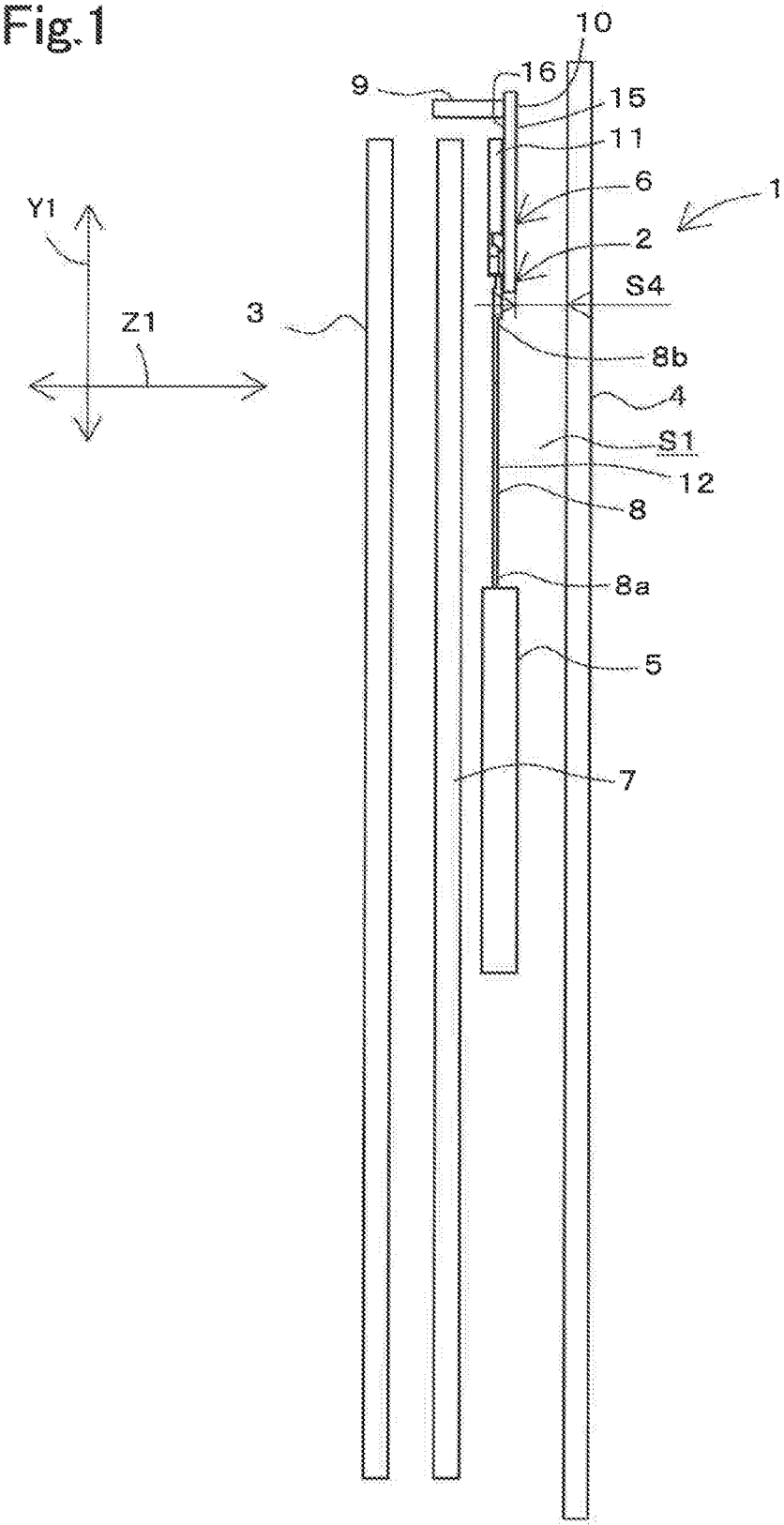
FIG. 1 is a schematic side view of a configuration of main portions of a liquid crystal display device according to a first embodiment of the present invention.
Figure 2:
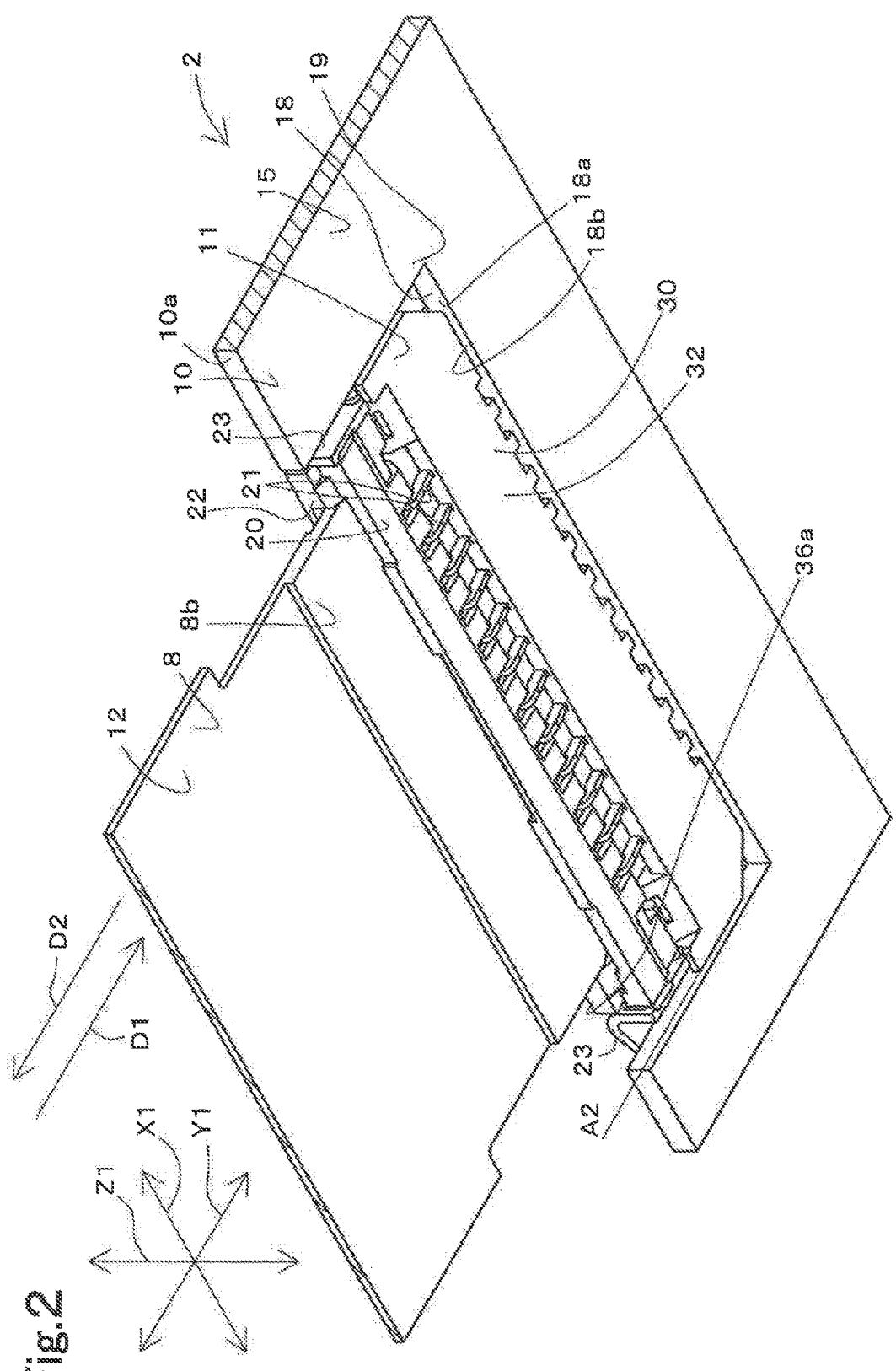
FIG. 2 is a perspective view of an electrical connector unit of the liquid crystal display device, and shows a state where the electrical connector unit is viewed from the front side.
Figure 3:
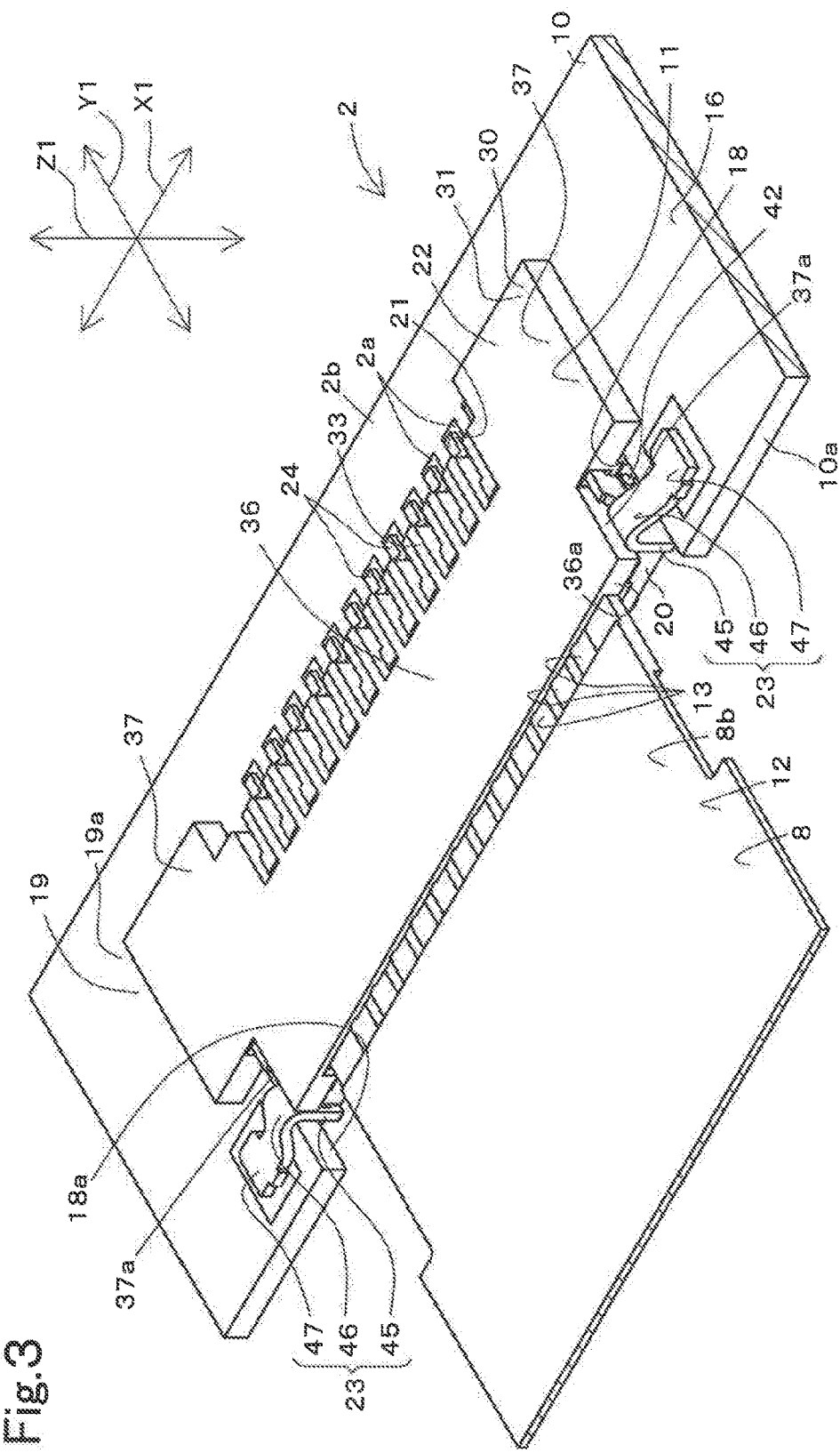
FIG. 3 is a perspective view of the electrical connector unit of the liquid crystal display device, and shows a state where the electrical connector unit is viewed from the rear side.
Figure 5:
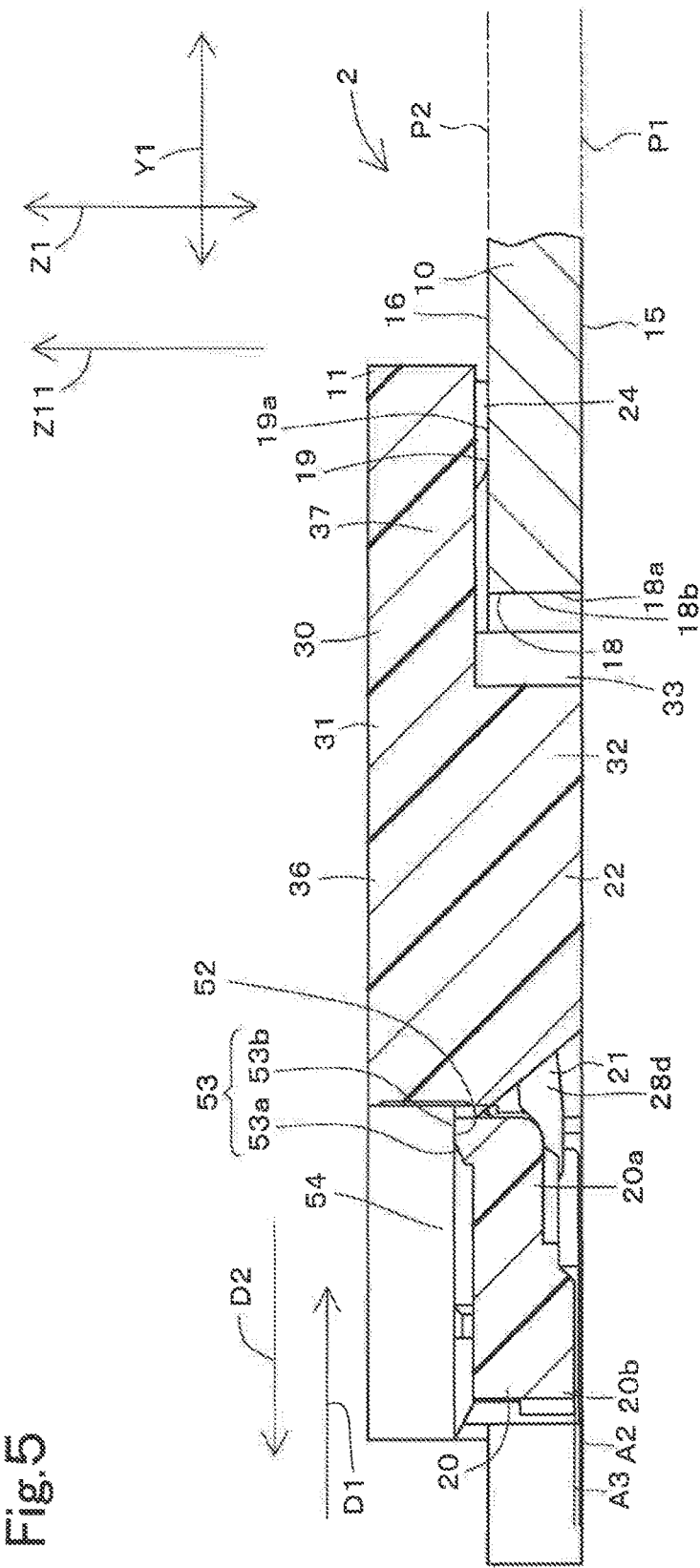
FIG. 5 is a cross-sectional view of the entirety of the electrical connector unit, and shows a state where the cross-sectional surface in FIG. 4 is viewed.
Figure 6:
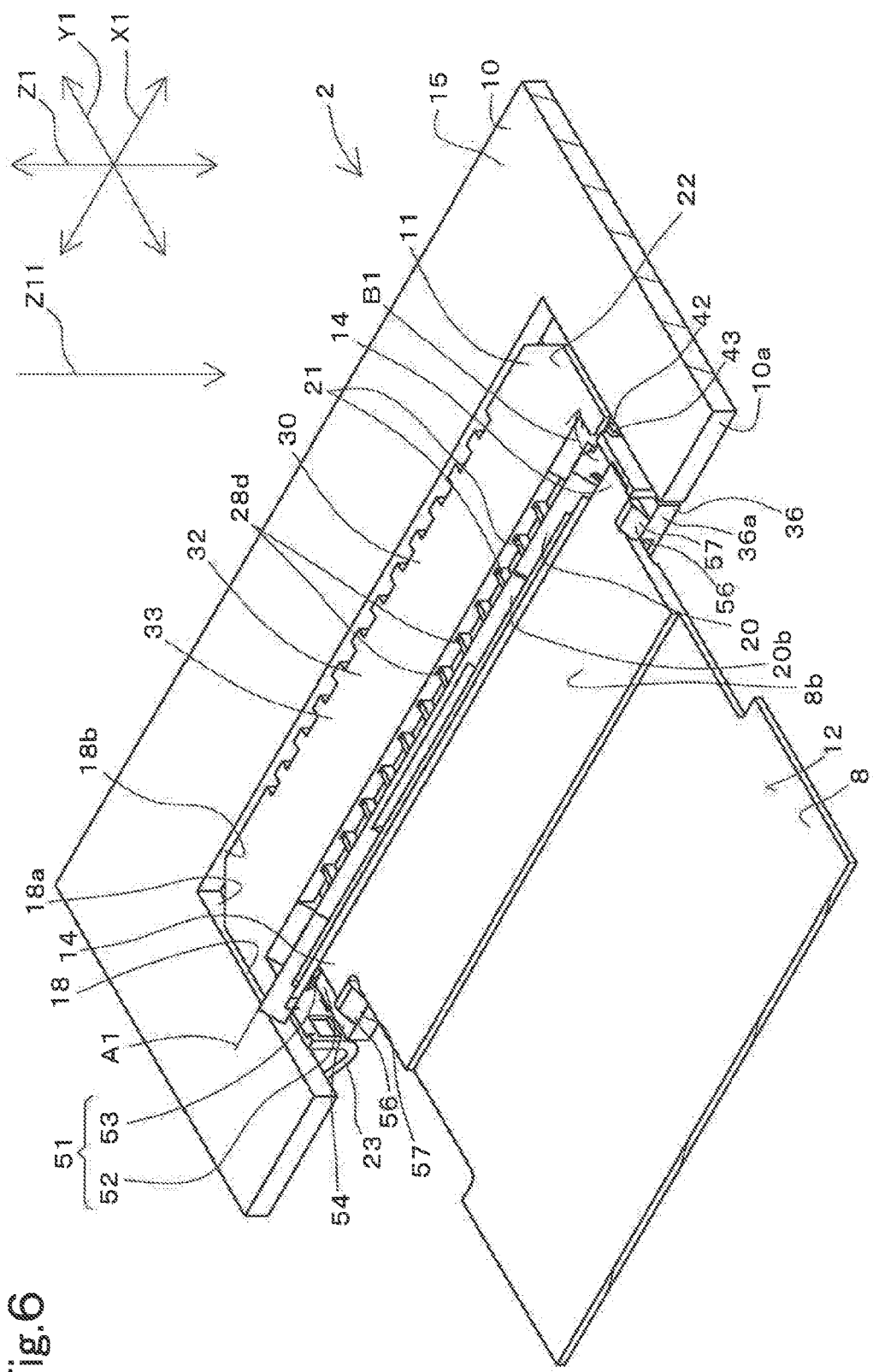
FIG. 6 is a perspective view of the electrical connector unit of the liquid crystal display device, and shows a state where the electrical connector unit is viewed from the front side, and where an actuator is at an open position.

FIG. 1 is a schematic side view of the configuration of main portions of a liquid crystal display device 1 according to a first embodiment of the present invention. FIG. 2 is a perspective view of an electrical connector unit 2 of the liquid crystal display device 1, and shows a state where the electrical connector unit 2 is viewed from the front side. FIG. 3 is a perspective view of the electrical connector unit 2 of the liquid crystal display device 1, and shows a state where the electrical connector unit 2 is viewed from the rear side. FIG. 4 is a perspective view of a partial cross-section of the electrical connector unit 2. FIG. 5 is a cross-sectional view of the entirety of the electrical connector unit 2, and shows a state where the cross-sectional surface in FIG. 4 is viewed. FIG. 6 is a perspective view of the electrical connector unit 2 of the liquid crystal display device 1, and shows a state where the electrical connector unit 2 is viewed from the front side, and where an actuator 20 is at an open position A1.

As shown in FIG. 1, the liquid crystal display device 1 is used as a television or a monitor, for example. The liquid crystal display device 1 has a panel 3, a chassis 4, a main substrate 5, and an illumination device 6.

The panel 3 is a liquid crystal panel that is attached to the front surface of the liquid crystal display device 1, and is shaped as a flat plate. The chassis 4 is a member that is arranged behind the panel 3, and constitutes a portion of the casing of the liquid crystal display device 1. In the present embodiment, the chassis 4 is shaped as a flat plate that extends parallel with the panel 3. The main substrate 5 and the illumination device 6 are arranged between the panel 3 and the chassis 4.

The main substrate 5 is a substrate on which driver circuits for controlling operations of the liquid crystal display device 1 and the like are implemented. The main substrate 5 is shaped as a flat plate, and in the present embodiment, is arranged adjacent to the illumination device 6.

The illumination device 6 is a backlight device that is attached to the back surface of the panel 3 and illuminates the panel 3, for example. Note that the illumination device 6 is not limited to being a backlight device for a liquid crystal panel, and it is possible to use an illumination lamp, a display lamp, or any of various other types of illumination devices, for example. The illumination device 6 is arranged in a narrow space between the panel 3 and the chassis 4.

The illumination device 6 has a light guide plate 7, the electrical connector unit 2, a flexible connection member 8, and an LED (Light Emitting Diode) 9 as a light emitting element.

The light guide plate 7 is a flat plate-shaped member for guiding light from the LED 9 to the panel 3. The light guide plate 7 is arranged between the panel 3 and the chassis 4. More specifically, the light guide plate 7 is arranged between the panel 3 and a group including the main substrate 5, the flexible connection member 8, and the electrical connector unit 2. The light guide plate 7 receives light from the LED 9, and this light is emitted from the light guide plate 7 onto the entirety of the panel 3.

Multiple LEDs 9 are arranged on an edge portion side (the upper edge portion in the present embodiment) of the light guide plate 7. The LEDs 9 are arranged at equal intervals along the lengthwise direction of the edge portion of the light guide plate 7. The LEDs 9 are mounted on an LED substrate 10 of the electrical connector unit 2. Note that although the LEDs 9 are used as light emitting elements in the present embodiment, the present invention is not limited to this. Other light emitting elements may be used instead of the LEDs 9. Power is supplied from the main substrate 5 to the LEDs 9 via the flexible connection member 8 and the electrical connector unit 2.

The flexible connection member 8 is provided in order to electrically connect the main substrate 5 and the LED substrate 10 of the electrical connector unit 2. In the present embodiment, the flexible connection member 8 is a flexible flat cable (FFC). Note that the flexible connection member 8 may have any configuration that has flexibility and electrical conductivity for example, and may be another member that enables electrical connection to an electrical connector 11 of the electrical connector unit 2, such as a flexible printed circuit (FPC).

The flexible connection member 8 is shaped as a long strip, and extends between the main substrate 5 and the electrical connector 11 of the electrical connector unit 2. In the present embodiment, the flexible connection member 8 extends in a straight line in a portion between the light guide plate 7 and the chassis 4.

As shown in FIGS. 1 to 6, the flexible connection member 8 has an insulation portion 12 and multiple conductive portions 13.

The insulation portion 12 is formed using an insulating material such as a synthetic resin. The insulation portion 12 is a long strip-shaped portion that extends along the lengthwise direction of the flexible connection member 8. One end portion of the insulation portion 12 is adjacent to the main substrate 5. The other end portion of the insulation portion 12 is adjacent to the electrical connector 11. An ear portion 14 is formed on each of two end portions, in the width direction of the flexible connection member 8, of the other end portion of the insulation portion 12. The ear portions 14 are small piece portions that protrude away from the widthwise central portion of the flexible connection member 8. As will be described later, the ear portions 14 are configured to be received by retaining portions 56 of a housing 22 of the electrical connector 11.

Multiple conductive portions 13 are arranged inside the insulation portion 12 that has the above configuration. The conductive portions 13 are formed using a material that has electrical conductivity, such as copper. The conductive portions 13 extend from one end portion 8a of the flexible connection member 8 (insulation portion 12) to another end portion 8b. The number of conductive portions 13 is set the same as the number of poles of the electrical connector 11, for example. The conductive portions 13 are arranged at equal intervals in a width direction X1 of the electrical connector 11, and are insulated from each other by the insulation portion 12.

One end portion of each of the conductive portions 13 is fixed, by soldering or the like, to a corresponding terminal among terminals (not shown) formed on the main substrate 5, and is electrically connected to the corresponding terminal. The other end portion of each of the conductive portions 13 is exposed from one side surface of the insulation portion 12 due to being arranged such that a portion of the other end portion of the insulation portion 12 is cut away. The conductive portions 13 are electrically connected to the electrical connector unit 2.

The electrical connector unit 2 has the LED substrate 10 and the electrical connector 11 that is mounted on a mounting portion 19 of the LED substrate 10, and this electrical connector 11 is configured to be connected to the flexible connection member 8. The electrical connector unit 2 is an example of a "substrate connection structure" or a "substrate with electrical connector" of the present invention.

The electrical connector unit 2 is arranged in a narrow space S1 between the light guide plate 7 and the chassis 4. For this reason, the electrical connector unit 2 is arranged so as to be as thin as possible in the thickness direction of the liquid crystal display device 1 (the direction orthogonal to the front surface of the panel 3). In the present embodiment, the electrical connector unit 2 is arranged in the vicinity of the upper portion of the panel 3.

The electrical connector unit 2 has the LED substrate 10 and the electrical connector 11, and is electrically connected to the main substrate 5 via the flexible connection member 8.

The LED substrate 10 is provided as a substrate member on which the LEDs 9 are mounted. The LED substrate 10 is shaped as a rectangular plate that is parallel with the chassis 4, the light guide plate 7, and the panel 3. In the present embodiment, the LED substrate 10 is arranged in the vicinity of the upper end of the panel 3. In the present embodiment, the LED substrate 10 is arranged separated from the chassis 4. The LED substrate 10 is arranged so as to be aligned with the main substrate 5 in the vertical direction, for example, in a narrow space between the light guide plate 7 and the chassis 4.

The LED substrate 10 has a configuration including a main body portion that is formed using a metal material having excellent heat conductivity such as aluminum, an insulation layer that is formed on the main body portion, and multiple conductive portions 2a that are formed on the insulation layer. The majority of the conductive portions 2a are covered by an insulation layer 2b. The conductive portions 2a of the LED substrate 10 are arranged parallel to each other. One end portion and other end portion of each of the conductive portions 2a constitute electrodes and are exposed from the insulation layer 2b. Note that unless particularly stated otherwise, the following description is given based on a state where the flexible connection member 8 is connected to the connector 11.

The LED substrate 10 has a first surface 15 and a second surface 16 that are parallel to each other. The second surface 16 faces the light guide plate 7 side (the front side of the liquid crystal display device 1), and the conductive portions 2a are arranged on the second surface 16. The first surface 15 faces the chassis 4 side (the rear side of the liquid crystal display device 1). The first surface 15 and the second surface 16 are parallel to each other.

Multiple LEDs 9 are mounted on the second surface 16 (one LED 9 is shown in FIG. 1, and the LEDs are not shown in figures other than FIG. 1). The LEDs 9 are arranged along a direction orthogonal to the paper surface in FIG. 1 (the left-right direction of the liquid crystal display device 1).

One end portion of each of the conductive portions 2a is arranged on the main substrate 5 side. The other end portion of each of the conductive portions 2a is connected to the cathode or the anode of the corresponding LED 9.

A notch portion 18 is formed in one edge portion 10a of the LED substrate 10 (in the present embodiment, the lower edge portion of the LED substrate 10 of the liquid crystal display device 1). Forming a partial cutaway in the LED substrate 10 completes the shape of the LED substrate 10. This notch portion 18 is provided in order to accommodate the electrical connector 11. The size of the notch portion 18 (the size when viewed in a direction orthogonal to the thickness direction of the LED substrate 10) is set to a size capable of accommodating the electrical connector 11. The notch portion 18 is shaped as an elongated rectangular space. The electrical connector 11 is arranged in this notch portion 18.

By accommodating at least a portion of the connector 11 in the notch portion 18, the overall thickness of the electrical connector unit 2 is reduced. In other words, the profile of the electrical connector unit 2 is reduced. The portion of the LED substrate 10 that surrounds the notch portion 18 includes a mounting portion 19 for mounting the electrical connector 11. A previously-mentioned mounting surface 19a of the mounting portion 19 is formed on the second surface 16 of the LED substrate 10. The mounting surface 19a is arranged around the one edge portion 10a of the notch portion 18, and includes portions to which later-described contacts 21 and two reinforcement tabs 23 of the electrical connector 11 are fixed. According to this configuration, the housing 22 of the electrical connector 11 is fixed to the mounting surface 19a of the LED substrate 10.

In the present embodiment, the electrical connector 11 (hereinafter, the electrical connector is also called simply "connector") is a so-called self-locking connector. Specifically, the connector 11 is configured such that by inserting the flexible connection member 8 into the connector 11, an operation of connecting the flexible connection member 8 to the connector 11 (an operation in which the actuator 20 of the electrical connector 11 is displaced from an open position A1 to a closed position A2) is also performed in conjunction.

The connector 11 is mechanically and electrically connected to the LED substrate 10. The connector 11 is also mechanically and electrically connected to the flexible connection member 8. In this way, in the present embodiment, the connector 11 is used as wire-to-board connector that connects a wire (the flexible connection member 8) and a board (the LED substrate 10).

Figure 7:
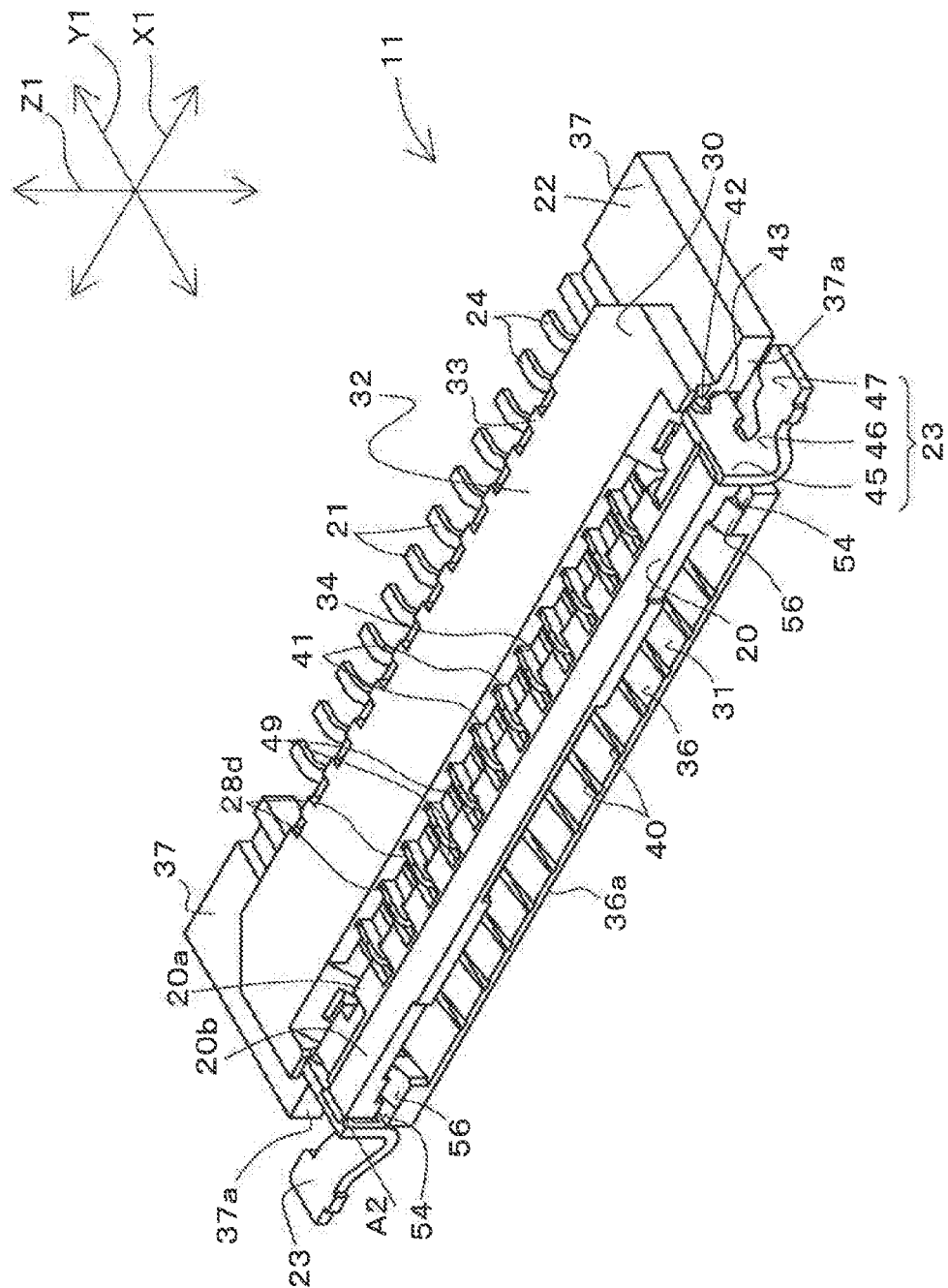
FIG. 7 is a perspective view of a connector, and shows a state where a top wall portion side of the connector is viewed.
Figure 8:
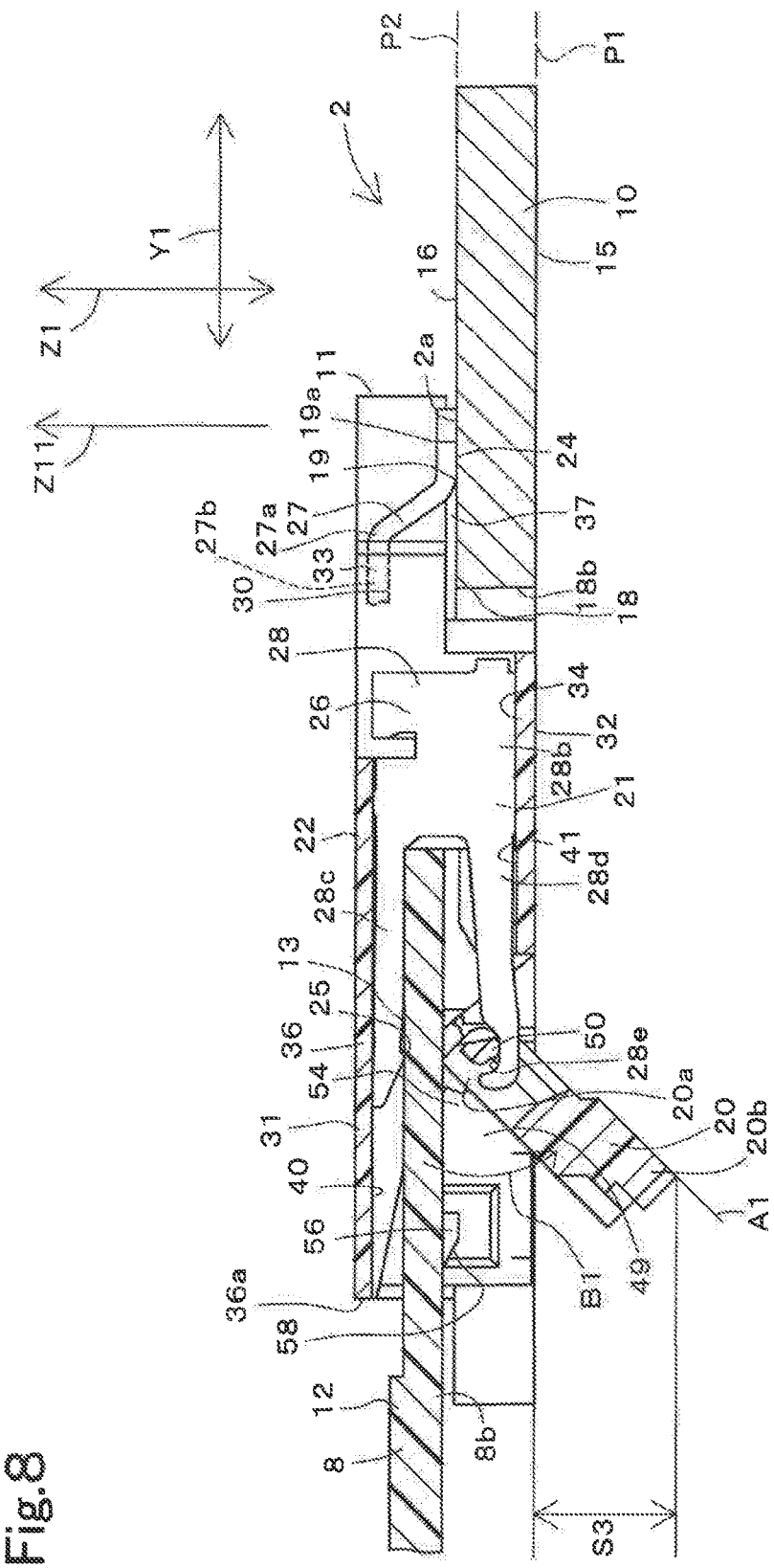
FIG. 8 is a cross-sectional view of the connector, and shows a state where the actuator is located at the open position.
Figure 9:
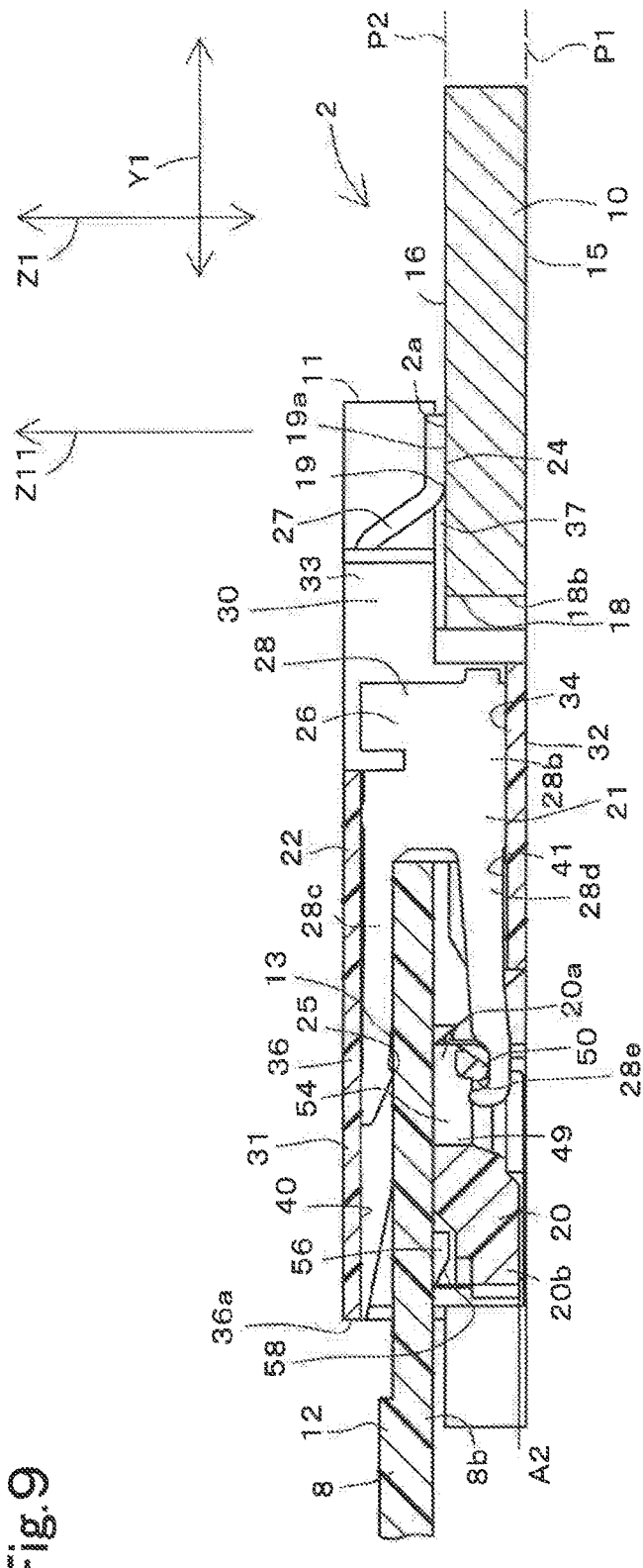
FIG. 9 is a cross-sectional view of the connector, and shows a state where the actuator is located at the closed position.
Figure 10:
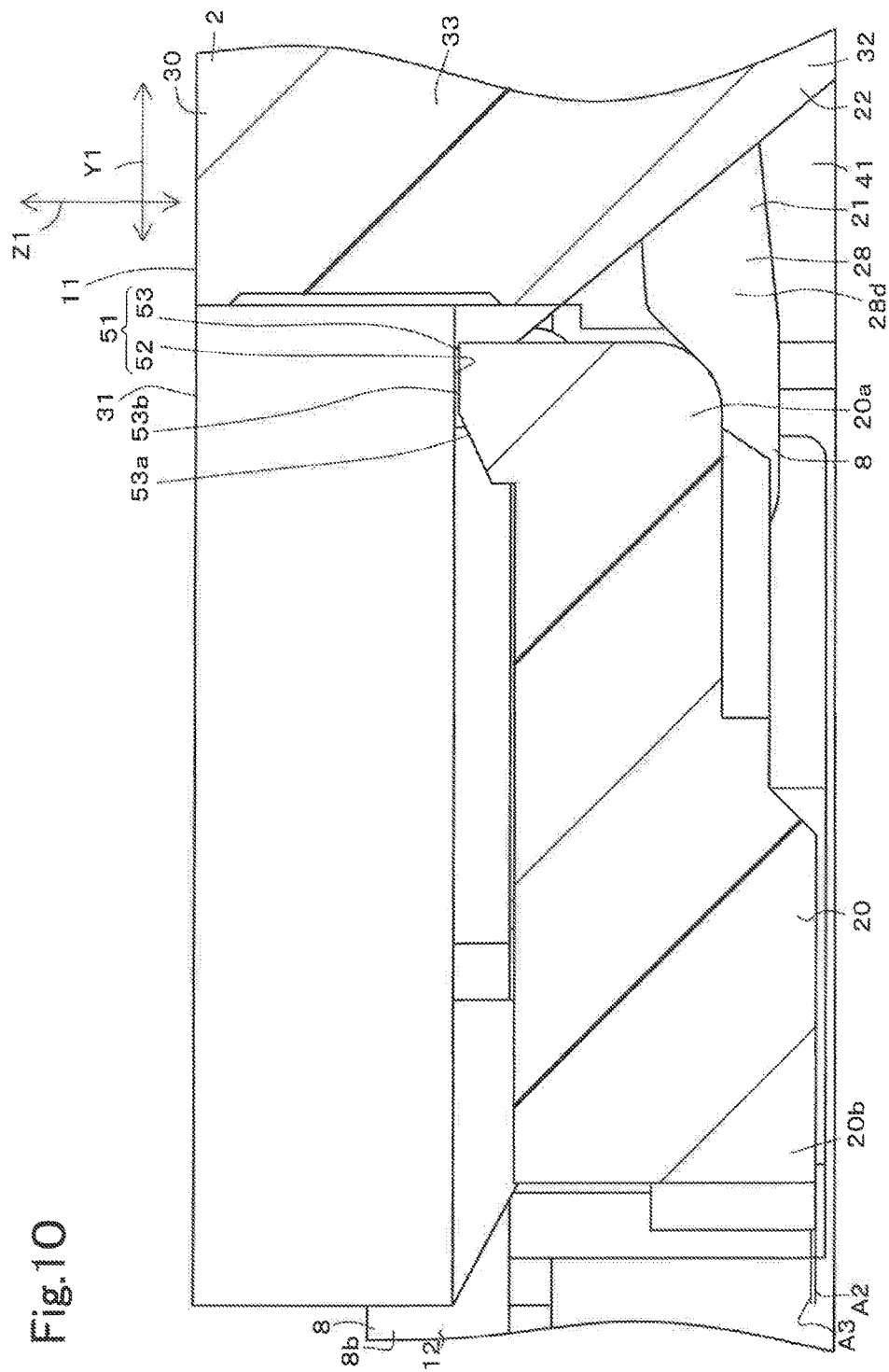
FIG. 10 is a cross-sectional view of main portions of the connector, and shows a state where the actuator is located at the closed position.
Figure 11:
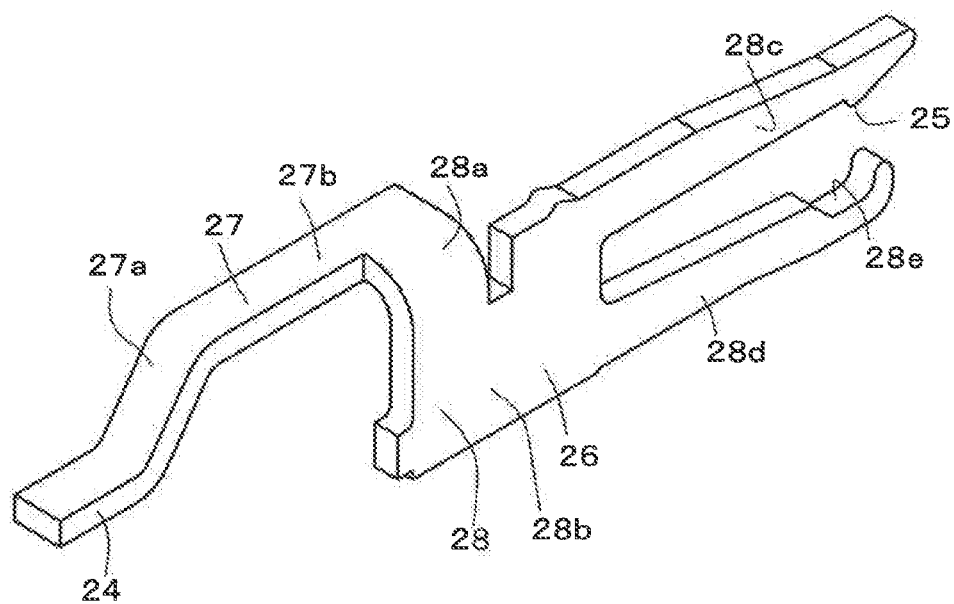
FIG. 11 is a perspective view of a contact of the connector.

FIG. 7 is a perspective view of the connector 11, and shows a state where a top wall portion 32 side of the connector 11 is viewed. FIG. 8 is a cross-sectional view of the connector 11, and shows a state where the actuator 20 is located at the open position A1. FIG. 9 is a cross-sectional view of the connector 11, and shows a state where the actuator 20 is located at the closed position A2. FIG. 10 is a cross-sectional view of main portions of the connector 11, and shows a state where the actuator 20 is located at the closed position A2. FIG. 11 is a perspective view of a contact 21 of the connector 11.

Note that in the depiction of the connector 11, there are cases where portions that appear repeatedly are not shown. In the following, the width direction X1 of the connector 11 is simply called "width direction X1", a length direction Y1 that is orthogonal to the width direction X1 of the connector 11 is simply called "length direction Y1", and a thickness direction Z1 that is orthogonal to both the width direction X1 and the length direction Y1 is simply called "thickness direction Z1".

As shown in FIGS. 1 to 11, the connector 11 has the actuator 20, electrically conductive contacts (predetermined partner conductive members) 21, an insulating housing 22 that holds the contacts 21, two reinforcement tabs 23 that are attached to the housing 22, and a provisional holding mechanism 51.

Multiple contacts 21 are arranged at substantially equal intervals along the width direction X1. The number of contacts 21 is set the same as the number of conductive portions 13 of the flexible connection member 8. The number of contacts 21 is the number of poles of the connector 11. The contacts 21 all have the like configuration.

The contacts 21 are configured to come into contact with the conductive portions 13 of the flexible connection member 8. The contacts 21 are each a conductive member formed by performing punching processing, bending processing, or the like on a metal material having a plating layer formed on the surface, and are each an integral article. The contacts 21 are each formed elongated in the length direction Y1, and come into contact with a corresponding conductive portion 13 of the flexible connection member 8 and a corresponding conductive portion 2a (electrode) of the LED substrate 10. The contacts 21 are each substantially y-shaped in a side view.

Each contact 21 has a first contact portion 24, a second contact portion 25, and a joining portion 26.

The first contact portion 24 is provided in order to come into contact with a corresponding conductive portion 2a of the LED substrate 10. The first contact portion 24 forms one end portion of the contact 21 in the length direction Y1. The first contact portion 24 is fixed, by soldering or the like, to a corresponding conductive portion 2a formed on the second surface 16 of the LED substrate 10, and can be in electrical conduction with that conductive portion 2a. The first contact portion 24 is continuous with the joining portion 26.

The joining portion 26 is provided in order to join the first contact portion 24 and the second contact portion 25 to each other. The joining portion 26 is substantially U-shaped in a side view.

The joining portion 26 has a first portion 27 that is continuous with the first contact portion 24, and a second portion 28 that is continuous with the second contact portion 25.

The first portion 27 is provided as a portion that is continuous with the first contact portion 24. The first portion 27 is shaped extending in an elongated manner along the length direction Y1. A portion of the first portion 27 has a bent shape, and thus a portion of the first portion 27 is arranged separated from the LED substrate 10 in the thickness direction Z1. In the present embodiment, the first portion 27 has a curved portion 27a that is curved so as to move away from the second surface 16 of the LED substrate 10 while extending from the first contact portion 24 toward the one edge portion 10a of the LED substrate 10. The first portion 27 also has a spanning portion 27b that spans a deep portion 18b of an edge portion 18a of the notch portion 18 at a position separated from the second surface 16. In the present embodiment, the curved portion 27a is S-shaped and has elasticity. In the present embodiment, the spanning portion 27b is formed with a straight shape. The first contact portion 24 of each of the contacts 21 is arranged between two support portions 37 of the housing 22 in the width direction X1, and does not protrude to one side in the length direction Y1 relative to the housing 22. The first portion 27 is continuous with the second portion 28.

The second portion 28 is provided as a portion that joins the first portion 27 and the second contact portion 25. At least a portion (in the present embodiment, a majority) of the second portion 28 is arranged inside housing 22.

The second portion 28 has a bent portion 28a, a second portion main body 28b, and a pair of arm portions 28c and 28d.

The second portion main body 28b constitutes one end portion of the second portion 28 in the length direction Y1. The bent portion 28a extends from one edge portion of the second portion main body 28b that is continuous with the first portion 27. The second bent portion 28a is L-shaped, and has a portion that is bent substantially 90 degrees. The bent portion 28a is also an L-shaped bent portion that extends toward the notch portion 18 from the other end portion of the first portion 27, which is on the side opposite to the one end portion that is continuous with the first contact portion 24. The second portion main body 28b is shaped as a flat plate that extends in a direction orthogonal to the width direction X1. In the present embodiment, a portion of the second portion main body 28b in the thickness direction Z1 is arranged so as to pass through the notch portion 18 of the LED substrate 10. Note that a configuration is possible in which only a portion of the second portion main body 28b is arranged inside the notch portion 18, and a configuration is possible in which the entirety of the second portion main body 28b is arranged inside the notch portion 18. The second portion main body 28b protrudes from the LED substrate 10 toward the second surface 16, but does not protrude toward the first surface 15. The second portion main body 28b supports the pair of arm portions 28c and 28d, and the pair of arm portions 28c and 28d extend from the second portion main body 28b.

The pair of arm portions 28c and 28d are provided as portions that extend from the second portion main body 28b toward one side in the length direction Y1. The arm portions 28c and 28d are each supported in a cantilevered manner by the second portion main body 28*b*, and are capable of undergoing elastic deformation in the thickness direction Z1 with a portion supported by the second portion main body 28*b* serving as the fulcrum. The pair of arm portions 28*c* and 28*d* are arranged separated and facing each other in the thickness direction Z1. The pair of arm portions 28*c* and 28*d* are arranged so as to sandwich the other end portion 8*b* of the flexible connection member 8. The other arm portion 28*d* is arranged inside the notch portion 18. The one arm portion 28*c* is arranged outside the space surrounded by the notch portion 18, on the second surface 16 side of the LED substrate 10. Note that the one arm portion 28*c* may be arranged inside the notch portion 18. The one arm portion 28*c* is arranged on a later-described bottom wall portion 31 side of the housing 22. The second contact portion 25 is provided on this one arm portion 28*c*.

The second contact portion 25 is configured to come into contact with a corresponding conductive portion 13 of the flexible connection member 8. The second contact portion 25 is a protrusion portion formed in the vicinity of the leading end of the one arm portion 28*c*, and protrudes toward the other arm portion 28*d*.

A latch portion 28*e* is formed in the leading end portion of the other arm portion 28*d*. The latch portion 28*e* is provided as a portion to which a lock shaft 50 of the actuator 20 is fitted, and is arranged facing the second contact portion 25 in the thickness direction Z1. Outer edge portions, in the thickness direction Z1, of the arm portions 28*c* and 28*d* are press-fitted into later-described fitting portions 34 of the housing 22. The contacts 21 having the above configuration are held by the housing 22 as previously mentioned.

Figure 12:
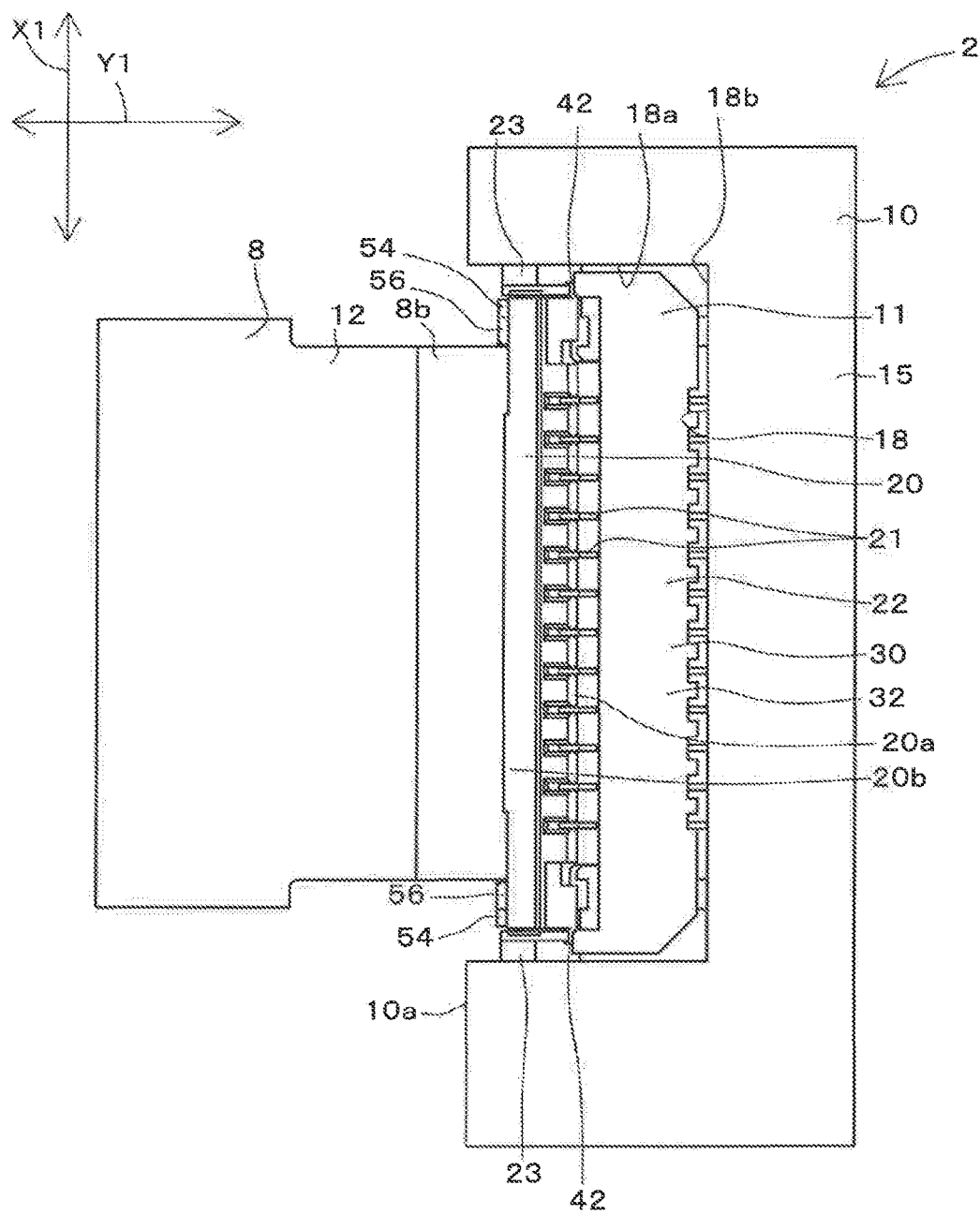
FIG. 12 is a plan view of a connector unit.
Figure 13:
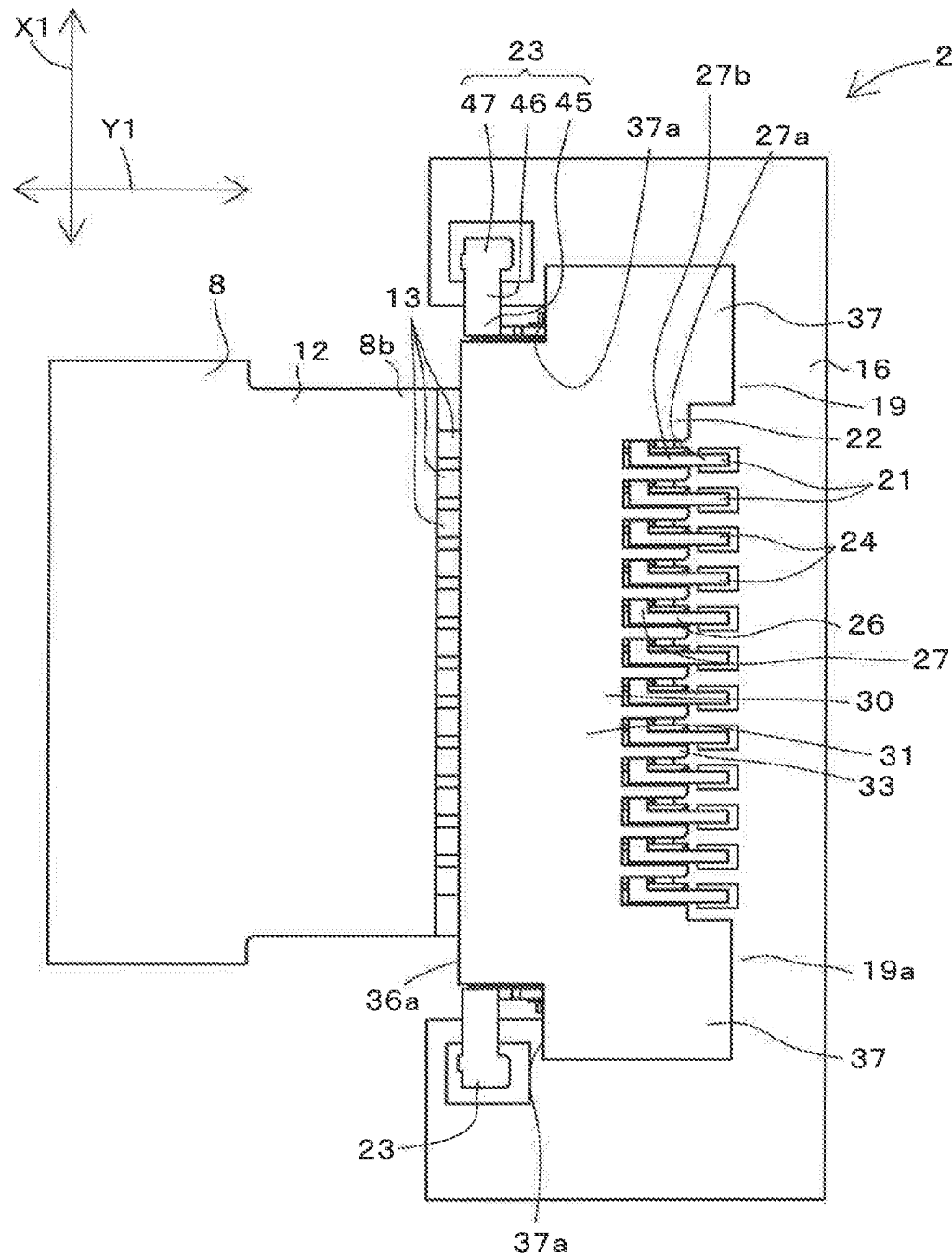
FIG. 13 is a bottom view of the connector unit.
Figure 14:
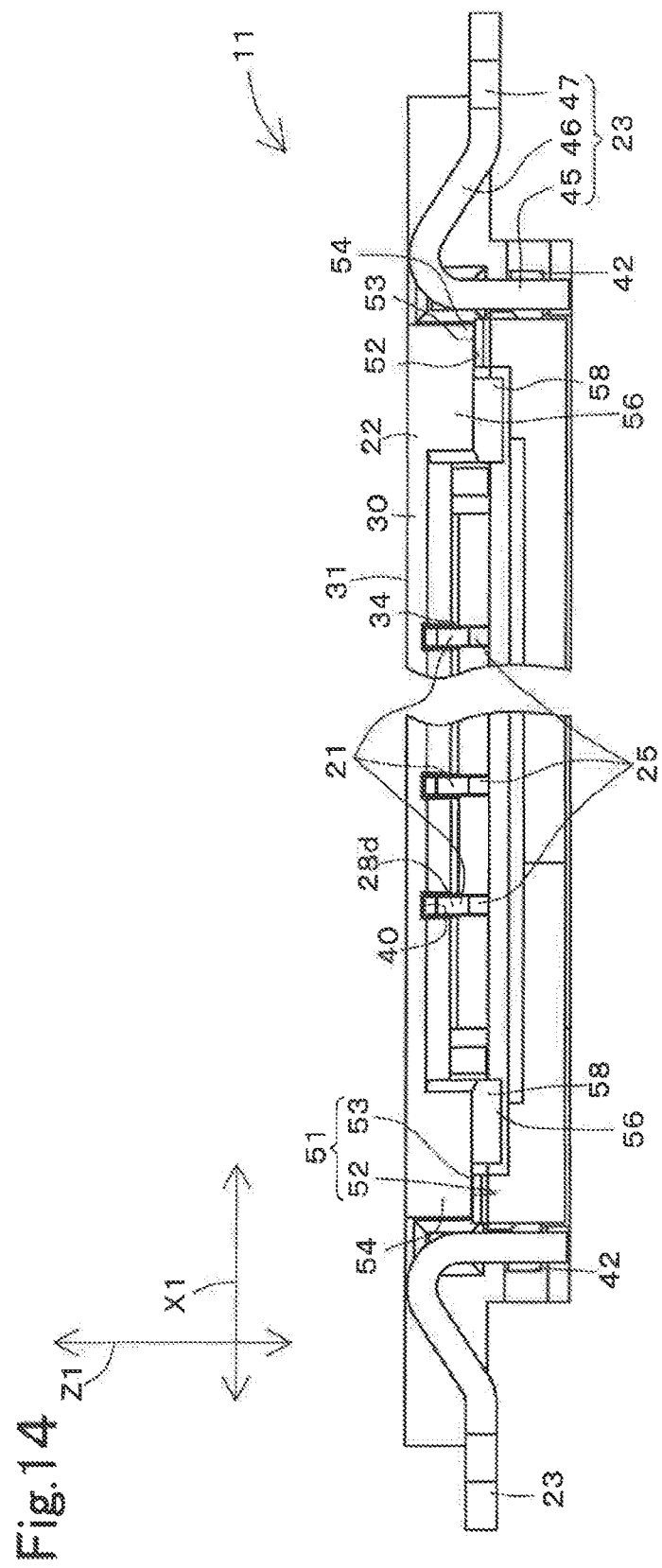
FIG. 14 is a front view of the connector.
Figure 15:
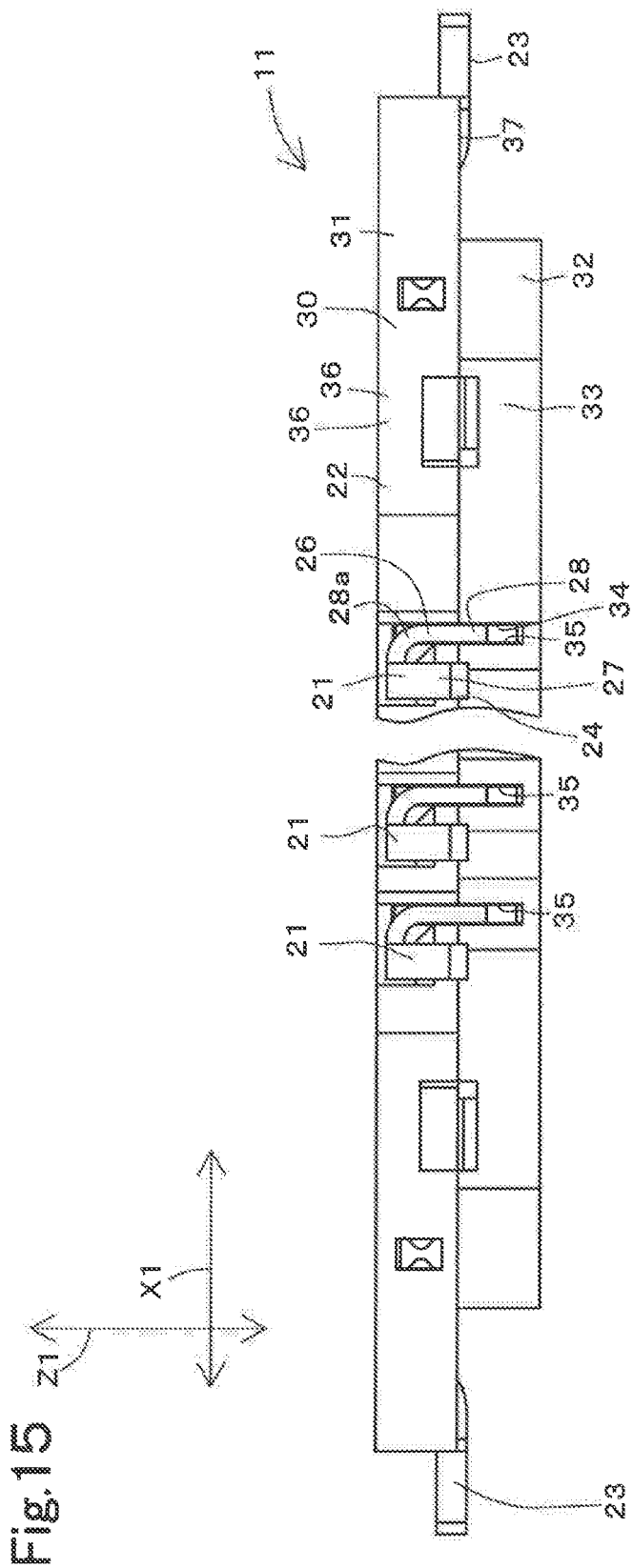
FIG. 15 is a back view of the connector.
Figure 16:
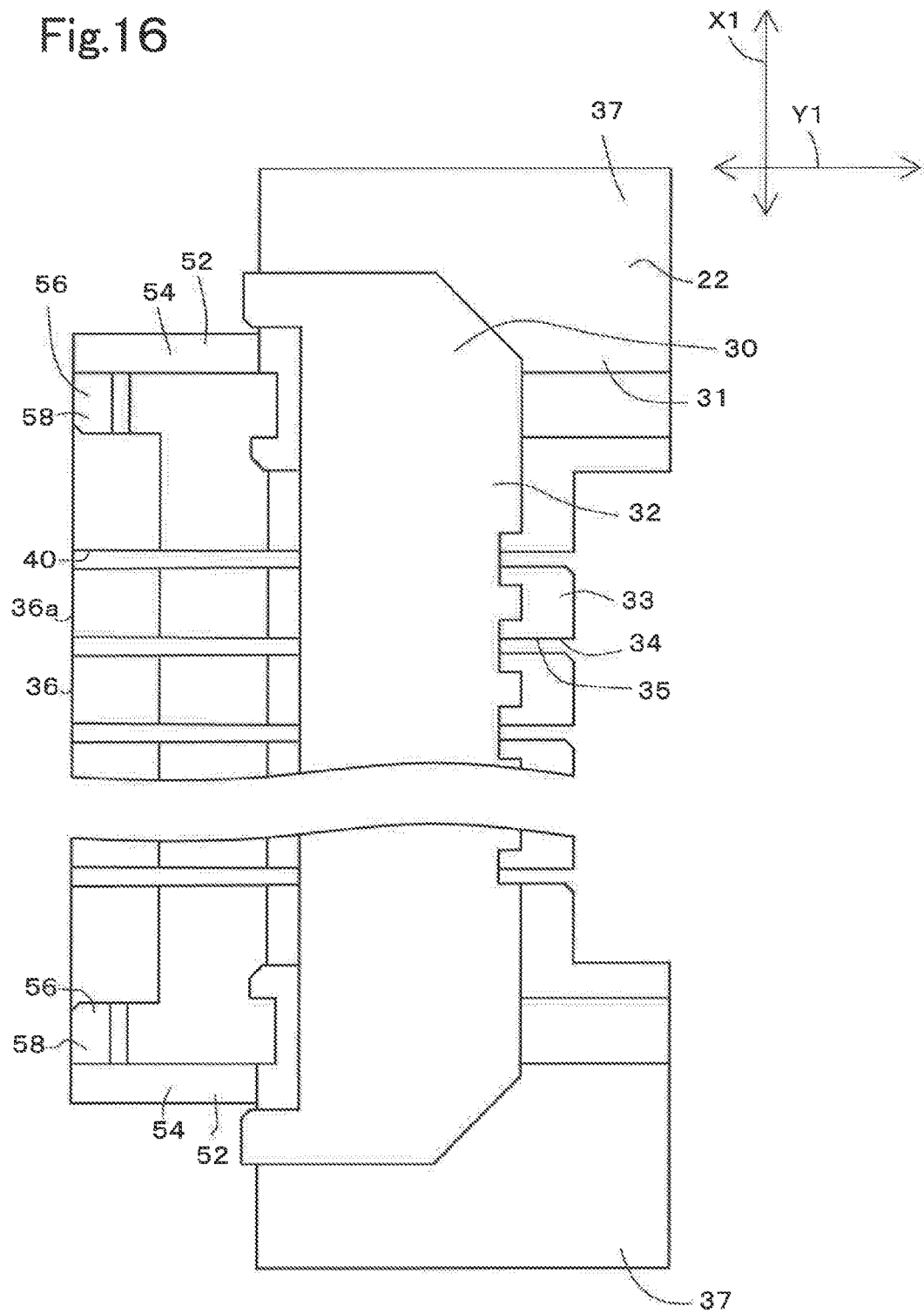
FIG. 16 is a plan view of a housing of the electrical connector.
Figure 17:
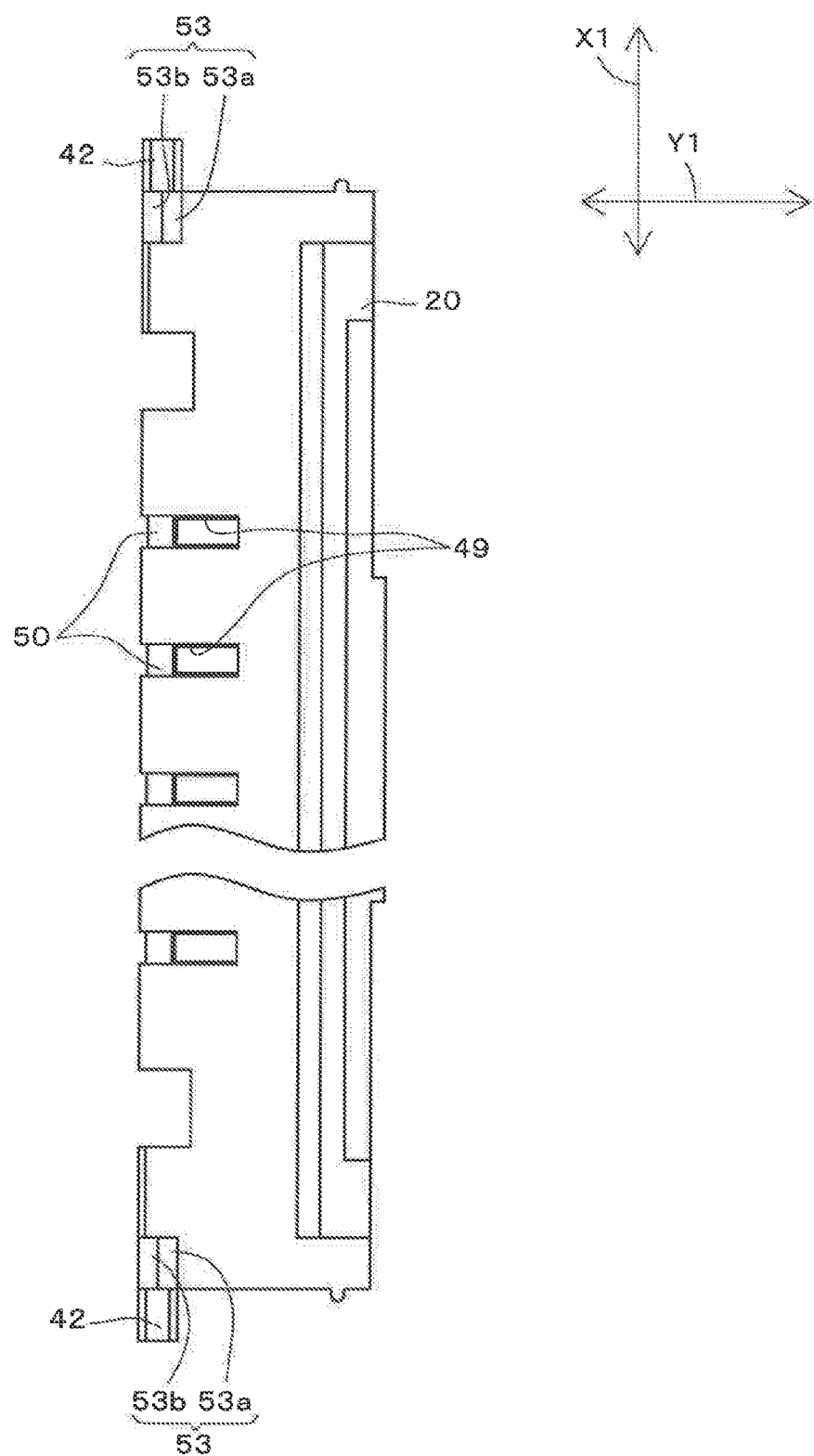
FIG. 17 is a rear view of the actuator of the electrical connector.

FIG. 12 is a plan view of the connector unit 2. FIG. 13 is a bottom view of the connector unit 2. FIG. 14 is a front view of the connector 11. FIG. 15 is a back view of the connector 11. FIG. 16 is a plan view of the housing 22 of the electrical connector 11. FIG. 17 is a rear view of the actuator 20 of the electrical connector 11 (a view of the portion that faces the bottom wall portion 31 side).

As shown in FIGS. 2, 3, 7, 9, and 12 to 17, the housing 22 is an integral molded article that is formed using a synthetic resin, and is an insulating member. The housing 22 is shaped extending in an elongated manner in the width direction X1, and is a flattened member that is thin in the thickness direction Z1. The housing 22 is shaped as a rectangle that is elongated in the width direction X1 in a plan view of the housing 22. Note that in the following, when view-related terms such as "plan view" and "side view" are given on their own, they refer to viewpoints based on the housing 22.

The housing 22 has a housing main body 30 that includes a bottom wall portion 31, a top wall portion 32, and a back portion 33, fitting portions 34 that are formed in the housing main body 30, and insertion hole portions 35.

The bottom wall portion 31 is provided as a portion that forms the bottom surface portion of the connector 11. The bottom wall portion 31 extends in a direction orthogonal to the thickness direction Z1. The bottom wall portion 31 is arranged nearer to the second surface 16, on which the conductive portions 2*a* are formed, of the LED substrate 10. In a bottom view, the bottom wall portion 31 is approximately shaped as a rectangle that is elongated in the width direction X1, and furthermore, portions of two end portions in the width direction X1 are shaped as rectangular protrusions that protrude outward in the width direction X1.

The bottom wall portion 31 has a bottom wall main body 36 and a pair of support portions 37.

The bottom wall main body 36 is provided as a portion that extends in an elongated manner in the width direction X1. In a plan view, the bottom wall main body 36 is located in the notch portion 18 of the LED substrate 10. The bottom wall main body 36 is arranged in the periphery of the notch portion 18, and in the present embodiment, is arranged nearer to the second surface 16 of the LED substrate 10. Note that a portion of the bottom wall main body 36 may be arranged inside the notch portion 18, or the entirety of the bottom wall main body 36 may be arranged outside the notch portion 18. A front end edge 36*a* of the bottom wall main body 36 does not protrude from the one edge portion 10*a* of the LED substrate 10 toward the flexible connection member 8. As will be described later, the contacts 21 are held by the bottom wall main body 36. The two support portions 37 are respectively provided on two end portions of the bottom wall main body 36 in the width direction X1.

The support portions 37 are provided as portions that are received by the second surface 16 of the LED substrate 10. These support portions 37 are shaped as flattened small pieces on the two end portions of the housing 22 in the width direction X1, and in the present embodiment, are formed having an angular shape in a plan view.

Portions of the first contact portions 24 of the contact 21 are arranged between the pair of support portions 37. The length of the support portions 37 in the length direction Y1 is set larger than the length in the width direction X1. Accordingly, the size of the housing 22 can be reduced in the width direction X1, and the opposing area of the LED substrate 10 and the two support portions 37 can be set even larger.

The two support portions 37 are arranged on the second surface 16 of the LED substrate 10 so as to be adjacent to the edge portions 18*a* of the notch portion 18, and can be received by the edge portions 18*a* and the second surface 16. Accordingly, the two support portions 37 are supported by the LED substrate 10 on the two sides in a state of ensuring a sufficient span in the width direction X1. The length of the two support portions 37 in the length direction Y1 is set to a length that is greater than or equal to half the length of the housing 22. Accordingly, the two support portions 37 can be supported in a more stable orientation with respect to the LED substrate 10. The two support portions 37 are connected to the bottom wall main body 36 at portions of the bottom wall main body 36 that avoid the front end edge 36*a* in the length direction Y1 (i.e., at rearward portions). Two notch portions 37*a* are formed by the forward portion of the bottom wall main body 36 and the corresponding support portions 37. The notch portions 37*a* are each defined by the end edge portion of the bottom wall main body 36 in the width direction X1 and the front end edge of the corresponding support portion 37 in the length direction Y1. In the present embodiment, the notch portions 37*a* each define a substantially rectangular space. The notch portions 37*a* are located outside the notch portion 18 of the LED substrate 10 on the second surface 16 side of the LED substrate 10. The top wall portion 32 is formed so as to face the bottom wall portion 31 in the thickness direction Z1.

The top wall portion 32 is provided as a portion that forms the ceiling portion of the connector 11. The top wall portion 32 is shaped as a rectangle that is elongated in the width direction X1 in a plan view. The size of the top wall portion 32 is set smaller than the size of the bottom wall portion 31 in a plan view. The top wall portion 32 is arranged on one end side of the bottom wall main body 36 in the length direction Y1 (toward the deep portion 18*b* side of the notch portion 18). The top wall portion 32 is arranged so as to expose a portion of the bottom wall portion 31 in a plan view.

The top wall portion 32 is arranged inside the notch portion 18 of the LED substrate 10 (inside the space defined by the notch portion 18). More specifically, the top wall portion 32 is arranged inside the notch portion 18 in a plan view, and is also arranged inside the notch portion 18 in a side view. That is to say, the top wall portion 32 is arranged between a virtual first plane P1 that includes the first surface 15 of the LED substrate 10 and a virtual second plane P2 that includes the second surface 16, and is shaped so as to not protrude from the first surface 15. The top wall portion 32 is arranged in substantially half of the region of the notch portion 18 in the length direction Y1, in a plan view. The top wall portion 32 is arranged in substantially the entire region of the notch portion 18 in the width direction X1, in a plan view. The back portion 33 is provided so as to connect the top wall portion 32 and the bottom wall portion 31.

The back portion 33 is arranged on one end portion side of the housing 22 in the length direction Y1, and is arranged so as to face the edge portion 18a in the deep portion 18b of the notch portion 18 of the LED substrate 10. The fitting portions 34 are formed spanning the bottom wall portion 31, the top wall portion 32, and the back portion 33.

The fitting portions 34 are provided as portions that hold the contacts 21. The fitting portions 34 are also provided as portions into which the other end portion 8b of the flexible connection member 8 is inserted. The fitting portions 34 extend along a predetermined insertion direction D1, which is a direction corresponding to one side in the length direction Y1. The housing 22 has a configuration in which the other end portion 8b of the flexible connection member 8 is inserted into the fitting portions 34 along the insertion direction D1. When the contacts 21 are displaced relative to the fitting portions 34 along an opposite direction D2 that is parallel with (opposite to) the insertion direction D1, portions of the contacts 21 are inserted into the fitting portions 34. Accordingly, the contacts 21 are held in the housing 22.

Multiple fitting portions 34 are formed at substantially equal intervals along the width direction X1 in the housing 22. The number of fitting portions 34 is the same as the number of contacts 21. The fitting portions 34 each hold a corresponding contact 21. The fitting portions 34 each have the same configuration.

Each fitting portion 34 has a bottom groove portion 40 that is formed in the bottom wall portion 31, a top groove portion 41 that is formed in the top wall portion 32, and an insertion hole portion 35 that is formed in the back portion 33.

The bottom groove portion 40 is a groove portion that is formed in the bottom wall portion 31, and extends along the length direction Y1. One end portion of the bottom groove portion 40 in the length direction Y1 is continuous with the insertion hole portion 35. The other end portion of the bottom groove portion 40 in the length direction Y1 is open at the front end edge 36a of the bottom wall portion 31. The bottom groove portion 40 is open on the top wall portion 32 side along the thickness direction Z1. One of the arm portions 28c of the contact 21 is accommodated in the bottom groove portion 40. The second contact portion 25 and a portion of the leading end side of the arm portion 28c are arranged so as to protrude from the bottom groove portion 40 toward the top groove portion 41.

The top groove portion 41 is a groove portion that is formed in the top wall portion 32, and extends along the length direction Y1. One end portion of the top groove portion 41 in the length direction Y1 is continuous with the insertion hole portion 35. The other end portion of the top groove portion 41 in the length direction Y1 is open at the front edge portion of the top wall portion 32 (on the flexible connection member 8 side). A base-side portion of the other arm portion 28d is accommodated in the top groove portion 41.

As previously described, with respect to the length direction Y1, the length of the top wall portion 32 is shorter than the length of the bottom wall portion 31. Accordingly, in a plan view, a portion of the bottom groove portion 40 is exposed, and portions of the pair of arm portions 28c and 28d on the leading end side are exposed. The top groove portion 41 is open on the bottom wall portion 31 side along the thickness direction Z1.

The insertion hole portion 35 is formed to one side of the first portion 27 in the width direction X1. The insertion hole portion 35 is provided such that the joining portion 26 and the second contact portion 25 are inserted into the fitting portion 34 by displacing the contact 21 in the opposite direction D2 relative to the housing 22. The insertion hole portion 35 is formed in the bottom wall portion 31, the top wall portion 32, and the back portion 33, and extends along the length direction Y1. The insertion hole portion 35 is formed so as to pass through the back portion 33 in the length direction Y1. The insertion hole portion 35 is shaped as a rectangle that is elongated in the thickness direction Z1, in a view from the length direction Y1.

The first contact portions 24 of the contacts 21 are arranged so as to be side-by-side and flush with (in the same plane as) the mounting portion 19 of the second surface 16 of the LED substrate 10 between the support portions 37. The first contact portions 24 of the contacts 21 are electrically and mechanically connected, by soldering or the like, to corresponding electrodes 2a formed on the mounting portion 19 of the second surface 16 of the LED substrate 10. By inserting the flexible connection member 8 into the fitting portions 34, the conductive portions 13 of the flexible connection member 8 are inserted between the pair of arm portions 28c and 28d of the corresponding contacts 21, and come into contact with the corresponding second contact portions 25.

The fitting portions 34 are arranged on the second surface 16 side of the LED substrate 10, and are shaped so as to not protrude from the first surface 15. According to this configuration, the other end portion 8b of the flexible connection member 8 does not protrude from the first plane P1 when inserted into the fitting portions 34. After the flexible connection member 8 has been inserted into the fitting portions 34, by then displacing the actuator 20 from the open position A1 to the closed position A2, the flexible connection member 8 comes into contact with the contacts 21 with a predetermined contact pressure.

The actuator 20 is formed using a synthetic resin, and is capable of elastic deformation. The actuator 20 has two shaft portions 42 that enable swinging relative to the housing 22. By swinging about the two shaft portions 42, the actuator 20 can be displaced to the open position A1, the closed position A2, and a provisional hold position A3, which are predetermined, relative to the housing 22.

The actuator 20 is configured such that by being arranged at the open position A1, pressure contact between the contacts 21 and the flexible connection member 8 can be canceled. The actuator 20 is also configured such that by being arranged at the predetermined closed position A2, the second contact portions 25 of the contacts 21 are allowed to be put into pressure contact with the flexible connection member 8. Furthermore, in the state where the flexible connection member 8 and the connector 11 are not connected to each other, by arranging the actuator 20 at the provisional hold position A3, it is held at the provisional hold position A3.

Out of the first surface 15 and the second surface 16, which are parallel to each other, of the mounting portion 19 of the LED substrate 10, the actuator 20 is arranged on the first surface 15 side. In the present embodiment, the actuator 20 is arranged inside the LED substrate 10 at the closed position A2. When located at the closed position A2, the actuator 20 is arranged at a position recessed from the first surface 15 with respect to the thickness direction of the LED substrate 10 (thickness direction Z1).

The actuator 20 is shaped as a rectangular plate that is elongated in the width direction X1. One end portion of the actuator 20 in the length direction Y1 is defined as a base end portion 20a, and the other end portion in the length direction Y1 is defined as a leading end portion 20b. The two shaft portions 42 that extend along the width direction X1 are formed on respective end portions of the actuator 20 in the width direction X1. The shaft portions 42 are arranged on the base end portion 20a of the actuator 20, and are separated from the leading end portion 20b.

These shaft portions 42 are fitted into hole portions 43 formed in later-described reinforcement tabs 23. The two shaft portions 42 are arranged facing the edge portions 18a of the notch portion 18 of the LED substrate 10, are arranged nearer to the virtual second plane P2 than the virtual first plane P1, and protrude from the second plane P2. The actuator 20 can swing about the two shaft portions 42 relative to the housing 22.

In the state where the flexible connection member 8 is not connected to the connector 11, in the space between the actuator 20 and the bottom wall main body 36, the thickness of the portion of this space through which flexible connection member 8 passes is set slightly smaller than the thickness of the other end portion 8b of the flexible connection member 8. Accordingly, when the flexible connection member 8 is inserted between the actuator 20 and the housing 22, the actuator 20 is slightly pressed in a direction of separation from the bottom wall main body 36 (to one side in the thickness direction Z1).

The length of the actuator 20 in the width direction X1 is the same as the length of the bottom wall main body 36 of the housing 22. The length of the actuator 20 in the length direction Y1 (facing direction in which the contacts 21 and the other end portion 8b of the flexible connection member 8 face each other) is set to a length less than or equal to half the length of the housing 22. In the present embodiment, the length of the actuator 20 in the length direction Y1 is set to substantially half the length of the housing 22.

The actuator 20 is arranged between two reinforcement tabs 23 on the front end edge side of the bottom wall portion 31 of the housing 22. Specifically, the actuator 20 is arranged on the leading end side of the housing 22 in the direction from the housing 22 toward the flexible connection member 8. According to the above configuration, when the actuator 20 is arranged at the open position A1, a protruding amount S3 of the actuator 20 (see FIG. 8) from the first surface 15 of the LED substrate 10 (the top wall portion 32 of the housing 22) is less than an interval S4 between the first surface 15 and the chassis 4 (see FIG. 1). Furthermore, this protruding amount S3 is set sufficiently smaller than the interval S4. Accordingly, a finger of a worker can be easily inserted between the light guide plate 7 and the actuator 20.

In the present embodiment, a direction Z11 that the mounting surface 19a of the LED substrate 10 faces is different from a displacement direction B1 in which the actuator 20 is displaced from the closed position A2 to the open position A1. More specifically, the mounting surface 19a faces the Z11 side in the thickness direction Z1, which is the direction opposite to the direction facing the chassis 4. On the other hand, the displacement direction B1 is the direction to one side in the circumferential direction about the two shaft portions 42, and includes a component from the first surface 15 of the LED substrate 10 toward the other side in the thickness direction Z1 (toward the chassis 4). In this way, in the present embodiment, the direction Z11, which is the direction that the mounting surface 19a of the LED substrate 10 faces, and the displacement direction B1 have components that are opposite to each other.

Multiple groove portions 49 are formed in the actuator 20 at substantially equal intervals in the width direction X1. The groove portions 49 are formed with a shape for accommodating the leading ends of the other arm portions 28d of the corresponding contacts 21.

A lock shaft 50 is formed in each of the groove portions 49 of the actuator 20. The lock shafts 50 are shaft portions that extend in the width direction X1 in the corresponding groove portions 49, and are fitted into the latch portions 28e of the other arm portions 28d of the corresponding contacts 21. The lock shafts 50 are each a cam shaft, and the distance from the central axis of the lock shaft 50 to the outer circumferential surface of the lock shaft 50 is not uniform.

As shown in FIG. 9, by arranging the actuator 20 at the predetermined closed position A2 where the actuator 20 is substantially parallel with the bottom wall portion 31, the second contact portions 25 of the contacts 21 are pressed against and in contact with the corresponding conductive portions 13 of the flexible connection member 8. On the other hand, in the case of unlocking the actuator 20, as shown in FIG. 8, the actuator 20 is rotated about the two shaft portions 42 and arranged such that the actuator 20 rises above the bottom wall portion 31. In other words, the actuator 20 is arranged at the predetermined open position A1. In this state, the cylindrical portions of the lock shaft portions 42 cancel the pressing of the other arm portions 28d. Accordingly, the flexible connection member 8 becomes unlocked. As a result, the flexible connection member 8 can be inserted into and withdrawn from the housing 22.

As shown in FIG. 9, when the actuator 20 is at the closed position A2, at least half (in the present embodiment, the majority of) the actuator 20 is arranged in the space S2 that is sandwiched between the virtual first plane P1 that includes the first surface 15 of the LED substrate 10 and the virtual second plane P2 that includes the second surface 16 of the LED substrate 10.

As shown in FIGS. 12 and 13, two reinforcement tabs 23 are respectively provided on two end portions, in the width direction X1, of the housing 22 that has the above configuration. The two reinforcement tabs 23 are members formed using the same material as the contacts 21. The two reinforcement tabs 23 are each substantially L-shaped in a plan view, and are substantially L-shaped in a front view. The two reinforcement tabs 23 are fixed to the respective end portions of the bottom wall main body 36 in the width direction X1, at locations in the vicinity of the front end edge 36a of the bottom wall main body 36.

The two reinforcement tabs 23 each have a first fixing portion 45 that is fixed to the bottom wall main body 36 of the housing 22, an extension portion 46 that extends from the corresponding first fixing portion 45 so as to move away from the first fixing portion 45 along the width direction X1, and a second fixing portion 47 that is formed at the leading end of the corresponding extension portion 46 and is fixed to the second surface 16 of the LED substrate 10.

The first fixing portion 45 is shaped as flat plate that extends in a direction orthogonal to the width direction X1, and is adjacent to the actuator 20 in the width direction X1. The first fixing portion 45 is arranged at the end portion of the bottom wall main body 36 in the width direction X1. A portion of the first fixing portion 45 that is on the rear end side in the length direction Y1 is embedded in the housing 22 in the periphery of the top wall portion 32 and the bottom wall main body 36, and thus the reinforcement tab 23 is fixed to the housing 22. A portion of the first fixing portion 45 that is on the front end side in the length direction Y1 is exposed from the housing 22 toward the one edge portion 10a of the LED substrate 10. The first fixing portion 45 is arranged between the top surface of the top wall portion 32 and the bottom surface of the bottom wall main body 36 in the thickness direction Z1, and does not protrude from the top wall portion 32 or the bottom wall main body 36 in the thickness direction Z1. A hole portion 43 for rotatably supporting a shaft portion 42 is formed in a portion of the first fixing portion 45 that is on the front end side and is exposed from the housing 22. In the present embodiment, the hole portion 43 is shaped as a depression in the one edge portion of the first fixing portion 45, and thus the shaft portion 42 can be fitted into the hole portion 43. The one edge portion of the first fixing portion 45 faces the front end surface of the top wall portion 32 of the housing 22, and is configured to sandwich the shaft portion 42 in conjunction with the front end surface. Accordingly, the shaft portion 42 is supported in a stable orientation by the reinforcement tab 23. In a plan view, the hole portion 43 is arranged side-by-side with the corresponding support portion 37 in the length direction Y1. The extension portion 46 extends from one end portion of the first fixing portion 45 in the thickness direction Z1.

The extension portion 46 is provided as a portion that joins the first fixing portion 45 and the second fixing portion 47, and is also provided as a portion that, when a load acts between the first fixing portion 45 and the second fixing portion 47, can dissipate the load by elastic deformation. A portion of the extension portion 46 that is connected to the first fixing portion 45 extends in a curved shape, and the second fixing portion 47, which is a rectangular plate-shaped portion, is formed at the leading end portion of the extension portion 46. In the present embodiment, the extension portion 46 extends from the first fixing portion 45 in an L-shaped curved manner while being separated from the bottom wall main body 36 of the housing 22. The first fixing portion 45 is arranged inside the notch portion 18 so as to extend along the edge portion 10a of the notch portion 18. The second fixing portion 47 is arranged at an outer end portion of the housing 22 in the width direction X1. The second fixing portion 47 is arranged side-by-side with the corresponding support portion 37 of the housing 22 in the length direction Y1. The second fixing portion 47 is fixed, by soldering or the like, to the mounting portion 19 adjacent to the edge portion 18a of the notch portion 18 of the LED substrate 10. The second fixing portion 47 is adjacent to the corresponding support portion 37 of the housing 22 in the length direction Y1.

A portion of each of the reinforcement tabs 23 is accommodated in the corresponding notch portion 37a of the housing 22. In the present embodiment, the entirety of the extension portion 46 of the reinforcement tab 23 is arranged inside the notch portion 37a. At least a portion of the second fixing portion 47 (in the present embodiment, the portion of the second fixing portion 47 on the base end side) is arranged inside the notch portion 37a. According to this configuration, the extension portion 46 of the reinforcement tab 23 does not protrude from the housing 22 in the width direction X1, the length direction Y1, and the thickness direction Z1, thus achieving a further reduction in the thickness of the connector 11. In the present embodiment, the extension portion 46 and the second fixing portion 47 are arranged at the front end of the notch portion 37a. According to the above configuration, a worker can easily be made aware of the coupling state of the LED substrate 10 and the two second fixing portions 47 of the two reinforcement tabs 23 through the notch portions 37a that are open toward one side in the width direction X1 and also open in the thickness direction Z1.

According to the above configuration, the shaft portions 42 of the actuator 20 are arranged in the vicinity of the rear ends, in the length direction Y1, of the notch portions 37a, and the second fixing portions 47 of the reinforcement tabs 23 are arranged in regions that are located toward the one edge portion 10a of the LED substrate 10 relative to the shaft portions 42 in the length direction Y1. According to this configuration, it is possible to ensure a larger distance from the shaft portions 42 to the front end edge 36a of the bottom wall portion 31. Accordingly, it is possible to ensure a larger distance from the shaft portions 42 to the leading end 20b of the actuator 20, thus making it possible to achieve a larger region for rotation of the actuator 20 while also reducing the thickness of the connector 11. Accordingly, the worker can be made more clearly aware of whether the actuator 20 is at the open position A1 or the closed position A2. The extension portions 46 and the second fixing portions 47 of the reinforcement tabs 23 are arranged between the front end edge 36a of the bottom wall portion 31 and the corresponding shaft portions 42 in the length direction Y1. Accordingly, the notch portions 37a are formed to one side of the region necessary for arrangement of the actuator 20 in the length direction Y1, and the extension portions 46 and the second fixing portions 47 are arranged at these locations. According to this configuration, members can be arranged with even higher efficiency in the space between the two end portions of the housing 22 in the width direction X1. As a result, it is possible to realize a further reduction in the size of the connector 11.

According to the above configuration, the housing 22 is supported to the LED substrate 10 in a stable orientation at multiple points, by the two reinforcement tabs 23 and the contacts 21. Specifically, the housing 22 is fixed to the mounting portion 19 of the LED substrate 10. The two reinforcement tabs 23 for fixing the housing 22 to the LED substrate 10, as well as the support portions 37 and the contacts 22 of the housing 22 are all supported by the second surface 16 of the LED substrate 10. Accordingly, it is possible to suppress the case where the above-described fixing portions become obstacles when the actuator 20 is operated by a finger or the like of the worker in order to perform a maintenance operation or the like on the liquid crystal display device 1.

As shown in FIGS. 4, 5, 6, and 10, in the present embodiment, the electrical connector 11 has a provisional holding mechanism 51. The provisional holding mechanism 51 is a mechanism for holding the actuator 20 at the predetermined provisional hold position A3 when the flexible connection member 8 is not connected to the connector 11. By providing the provisional holding mechanism 51, the actuator 20 is restricted from unexpectedly becoming displaced relative to the housing 22 due to vibration or the like when the connector 11 is transported, for example.

Specifically, the provisional holding mechanism 51 restricts displacement of the actuator 20 relative to the housing 22 at the provisional hold position A3, thus restricts displacement of the actuator 20 to a position of protruding from the housing 22. In the present embodiment, the provisional holding mechanism 51 is formed inside the connector 11. In the present embodiment, out of the first surface 15 and the second surface 16, the provisional holding mechanism 51 is arranged on the second surface 16.

The provisional holding mechanism 51 has first engagement portions 52 that are restricted from becoming displaced relative to the housing 22 by being provided on at least one of the housing 22 and a member fixed to the housing 22, and second engagement portions 53 that are provided on the actuator 20 and are engaged with the first engagement portions 52 at the provisional hold position A3. In this configuration, engagement of the first engagement portions 52 and the second engagement portions 53 is prevented (arrival of the actuator 20 at the provisional hold position A3 is prevented) by insertion of the flexible connection member 8 between the bottom wall portion 31 of the housing 22 and the actuator 20.

The first engagement portions 52 constitute a portion of the housing 22. The first engagement portions 52 are arranged avoiding a region of the housing 22 through which the flexible connection member 8 passes. Specifically, the first engagement portions 52 are provided on the bottom wall main body 36 of the housing 22. The first engagement portions 52 are respectively arranged in two end portions of the bottom wall main body 36 in the width direction X1.

More specifically, the bottom wall main body 36 of the housing 22 has two fencing portions 54 that are respectively formed on the two width direction X1 sides of the passing portion through which the flexible connection member 8 passes, and these two fencing portions 54 protrude toward the actuator 20. The two fencing portions 54 extend from the front end edge 36a of the bottom wall main body 36 toward the back portion 33 along the length direction Y1. The upper surfaces of the fencing portions 54 are flat surfaces that are orthogonal to the thickness direction Z1. Accordingly, the two fencing portions 54 have facing portions that face the base end portion 20a of the actuator 20 in the thickness direction Z1. These facing portions include the first engagement portions 52.

Note that bottom wall main body 36 of the housing 22 is provided with two retaining portions 56 that are adjacent to the two fencing portions 54. The two retaining portions 56 are block-shaped portions that are formed on one side of the corresponding fencing portions 54, namely the side on which the front end edge 36a of the bottom wall portion 31 is located. The two retaining portions 56 protrude upward from the bottom wall main body 36 and can engage with corresponding ear portions 14 of the insulation portion 12 of the flexible connection member 8. Accordingly, the flexible connection member 8 is prevented from coming out of the connector 11.

The second engagement portions 53 are formed integrally with the actuator 20. In the present embodiment, the second engagement portions 53 are formed by protruding portions (protrusion-shaped portions). The second engagement portions 53 are provided on the base end portion 20a of the actuator 20. In the present embodiment, the second engagement portions 53 are respectively arranged on the two end portions of the actuator 20 in the width direction X1, and are adjacent to the two shaft portions 42. In the width direction X1, the positions of the first engagement portions 52 are aligned with the positions of the corresponding second engagement portions 53. One side surface 53a of each of the second engagement portions 53 is arranged so as to face the first engagement portion 52 in the thickness direction Z1 when the actuator 20 is located at the provisional hold position A3. In the present embodiment, the closed position A2 is substantially the same as the provisional hold position A3, but is a position at which the actuator 20 is slightly above the bottom wall portion 31 compared to the provisional hold position A3.

The one side surface of each of the second engagement portions 53 has an inclined portion 53a and a flat portion 53b.

The inclined portion 53a is a surface that is inclined so as to approach the first engagement portion 52 while approaching the two shaft portions 42. The inclined portion 53a is continuous with the flat portion 53b. The flat portion 53b is a flat surface that is provided as a portion that comes into direct contact with the first engagement portion 52, and can come into plane contact with the first engagement portion 52.

As shown in FIGS. 4 and 5, when the actuator 20 is at the provisional hold position A3, the actuator 20 extends substantially parallel with the bottom wall portion 31. At this time, the flat portions 53b of the two second engagement portions 53 are in contact with the corresponding first engagement portions 52. At this time, the height (protruding amount) of the second engagement portion 53 from the actuator 20 is set to a predetermined value. Accordingly, the two second engagement portions 53 are in contact with and pressed against the corresponding first engagement portions 52. Accordingly, the two second engagement portions 53 are engaged with the corresponding first engagement portions 52 in a surface-contact state and with sufficient engagement force. Accordingly, in the width direction X1, the actuator 20 is supported on two sides by the first engagement portions 52. The actuator 20 is therefore held in a stable orientation at the provisional hold position A3 relative to the housing 22, and is restricted from becoming displaced relative to the housing 22. In other words, the actuator 20 is held at the provisional hold position A3 by engagement of the first engagement portions 52 and the second engagement portions 53 of the provisional holding mechanism 51.

Next, the worker displaces the actuator 20 about the two shaft portions 42, thus displacing the actuator 20 from the provisional hold position A3 to the open position A1 (see FIG. 6). Then, from this state, the two ear portions 14 of the other end portion 8b of the flexible connection member 8 are inserted between the two retaining portions 56 and the fitting portions 34, and the other end portion 8b is aligned with the upper surface of the bottom wall main body 36.

Next, the worker inserts the other end portion 8b of the flexible connection member 8 between the bottom wall main body 36 of the housing 22 and the actuator 20. Accordingly, as shown in FIGS. 8 and 9, the flexible connection member 8 subjects the actuator 20 to a load for pushing up the actuator 20 to one side in the thickness direction Z1. As a result, the actuator 20 elastically deforms so as to bend, with the two shaft portions 42 serving as the fulcrum, and thus the first engagement portions 52 move away from the second engagement portions 53. In other words, the function of the provisional holding mechanism 51 for provisionally locking the actuator 20 is canceled.

As this operation is performed, the flexible connection member 8 displaces the actuator 20 from the open position A1 to the closed position A2. Accordingly, as previously described, the second contact portions 25 of the contacts 21 come into pressure contact with the corresponding conductive portions 13 of the flexible connection member 8, and electrical connection of the flexible connection member 8 and the connector 11 is achieved.

As described above, according to the connector unit 2, the second fixing portions 47 of the reinforcement tabs 23 and the support portions 37 of the housing 22 are arranged on the second surface 16 of the LED substrate 10. Also, the housing 22 has a configuration in which the support portions 37 protrude from the bottom wall main body 36 in the width direction X1, and thus the spaces surrounded by the support portions 37 and the bottom wall main body 36 form the notch portions 37a. Also, the second fixing portions 47 of the reinforcement tabs 23 are arranged inside these notch portions 37a. Accordingly, the support portions 37, which are arranged on the end portions of the housing 22 in the width direction X1 and are supported by the LED substrate 10, and the second fixing portions 47 are side-by-side in the length direction Y1. Because the support portions 37 of the housing 22 and the second fixing portions 47 of the reinforcement tabs 23 are side-by-side in the length direction Y1 on the sides of the bottom wall main body 36 in this way, the overall length of the connector 11 in the width direction X1 and the overall thickness can be made even smaller (thickness reduction can be achieved). As a result, it is possible to achieve a further reduction in the thickness of the connector unit 2.

According to the connector unit 2, the reinforcement tabs 23 are connected to the housing 22 and the LED substrate 10, and are used as members that support the shaft portions 42 of the actuator 20. Accordingly, hole portions for the shaft portions 42 do not need to be formed in the housing 22, thus making it possible to further reduce the thickness of the housing 22, and consequently making it possible to realize a further reduction in the thickness of the connector unit 2.

According to the connector unit 2, the first fixing portions 45 of the reinforcement tabs 23 are arranged at end portions of the bottom wall main body 36 in the width direction X1, and the hole portions 43 of the reinforcement tabs 23 are formed in the first fixing portions 45, and are arranged side-by-side with the support portions 37 in the length direction Y1. According to this configuration, the support portions 37 of the housing 22, the second fixing portions 34 of the reinforcement tabs 23, and the hole portions 43 of the reinforcement tabs 23 are arranged along the length direction Y1. Accordingly, it is possible to further shorten the length of the connector 11 in the width direction X1.

According to the connector unit 2, when the actuator 20 is located at the closed position A2, the actuator 20 is arranged at a position recessed from the first surface 15 with respect to the thickness direction Z1 of the LED substrate 10. Accordingly, the actuator 20 does not protrude from the first surface 15 of the LED substrate 10, thus making it possible to achieve a further reduction in the overall thickness of the connector unit 2 (substrate connection structure) that includes the actuator 20 and the LED substrate 10.

According to the connector unit 2, the direction Z11, which is the direction that is faced by the second surface 16 (the mounting surface 19a) on which the housing 22 of the connector 11 is implemented, is different from the displacement direction B1, which is the direction in which the actuator 20 is displaced from the closed position A2 to the open position A1. Accordingly, it is possible to suppress cases where the mounting portion 19 comes into contact with a finger or the like when the worker operates the actuator 20 with a finger or the like, for example. The mounting portion 19 therefore does not become an obstacle when the worker operates the actuator 20. In other words, it is possible to ensure a larger amount of space for operating the actuator 20. In this way, by ensuring a larger amount of space for operating the actuator 20, a worker or the like can more easily operate the actuator 20 even in a case where many parts including the connector unit 2 are arranged in a narrow (small) space S1.

According to the connector unit 2, the curved portion 27a of the first portion 27 of the joining portion 26 of each of the contacts 21 is formed with a curved shape between the second contact portion 25 and the first contact portion 24 that is fixed to the LED substrate 10. Accordingly, when external force acts on the contact 21, this curved portion deforms as a spring, and therefore the contact 21 can flexibly handle this external force. Accordingly, it is possible to suppress cases where an excessive force acts between the contact 21 and the LED substrate 10. The first portion 27 of the joining portion 26 of the contact 21 spans the edge portion 18a of the notch portion 18 at a position separated from the second surface 16. Accordingly, it is possible to further increase the distance (creepage distance of insulation) from the conductive layer inside the LED substrate 10, which is generally exposed to the edge portion 18a of the notch portion 18, thus making it possible to more reliably suppress cases where a short occurs between the contact 21 and this conductive layer. The second contact portion 25 of the contact 22 is arranged at a location separated from the LED substrate 10 (in the vicinity of the notch portion 18). Accordingly, the LED substrate 10 and the second contact portion 25 are not arranged so as to be overlapped in the thickness direction of the LED substrate 10, and as a result, it is possible to reduce the overall length of the contact 21 and the LED substrate 10 in the thickness direction Z1. In other words, it is possible to realize a reduction in the height of the connector 11 relative to the LED substrate 10. In this way, it is possible to simultaneously exhibit effects that are difficult to achieve together, namely an increase in the degree of freedom in deformation of the contact 21, an improvement in insulation performance, and a reduction in the height of the connector unit 2.

According to the connector unit 2, the extension portions 46 of the reinforcement tabs 23 extend in a curved L shape from the first fixing portions 45 while also being separated from the housing 22. According to this configuration, the extension portions 46 of the reinforcement tabs 23 are formed with a curved L shape while also being separated from the housing 22. Accordingly, when external force acts on the reinforcement tabs 23, this curved portion deforms as a spring, and therefore the reinforcement tabs 23 can flexibly handle this external force. Accordingly, it is possible to suppress cases where an excessive force acts on the housing 22 and the contacts 21.

According to the connector unit 2, the first fixing portions 45 of the reinforcement tabs 23 are arranged in the notch portion 18 so as to extend along the edge portions 18a of the notch portion 18, and the second fixing portions 47 are arranged at the end portions of the housing 22 in the width direction X1. According to this configuration, the housing 22 is supported at multiple points on the substrate in a stable orientation by the reinforcement tabs 23 and the contacts 21.

According to the connector unit 2, with respect to the thickness direction Z1, when at the closed position A2, half or more of the actuator 20 is arranged in the space S2 that is sandwiched by the virtual first plane P1 that includes the first surface 15 and the virtual second plane P2 that includes the second surface 16. According to this configuration, it is possible to achieve an even further reduction in the thickness of the connector unit 2.

According to the connector unit 2, the notch portion 18 is formed in the one edge portion 10a of the LED substrate 10, and the actuator 20 is arranged in the notch portion 18. According to this configuration, a portion of the space substantially occupied by the LED substrate 10 in the thickness direction Z1 of the LED substrate 10 can be used as space for arranging the actuator 20. Accordingly, it is possible to achieve a further reduction in the thickness and the size of the connector unit 2.

According to the connector unit 2, the two shaft portions 42 of the actuator 20 are arranged facing the edge portions 18a of the notch portion 18 of the LED substrate 10. According to this configuration, by arranging the actuator 20 in the vicinity of the edge portions 18a, it is possible to achieve a further reduction in the thickness of the connector unit 2.

According to the connector unit 2, the housing 22 has the support portions 37 that can be supported by the second surface 16 of the LED substrate 10. According to this configuration, the support portions 37 of the housing 22 are arranged on the second surface 16 of the LED substrate 10, which is on the side opposite to the first surface 15 that the actuator 20 is arranged adjacent to. Accordingly, the thickness of the connector unit 2 on the first surface 15 side is not increased. It is therefore possible to more firmly fix the housing 22 to the LED substrate 10 while also realizing a reduction in the thickness of the connector unit 2. Moreover, the support portions 37 are not arranged on the first surface 15 side of the LED substrate 10, which is the surface that is nearer the actuator 20, and therefore the support portions 37 do not become obstacles when the actuator 20 is operated by a finger of the worker, for example. In particular, when the LED substrate 10 is arranged in the narrow space between the light guide plate 7 and the chassis 4, the effect of improving the ease-of-operation of the actuator 20, by preventing the support portions 37 from becoming obstacles, is significant.

According to the connector unit 2, the actuator 20 is formed having a length that is less than or equal to half the length of the housing 22 in the facing direction (length direction Y1) in which the contacts 21 and the flexible connection member 8 face each other. According to this configuration, when the actuator 20 is opened from the closed position A2 to the open position A1, the protruding amount of the actuator 20 from the LED substrate 10 can be particularly reduced. Accordingly, even in the case of a narrow space for insertion of a finger of the worker or the like for operation of the actuator 20, the actuator 20 can be reliably displaced from the closed position A2 to the open position A1 by the finger or the like.

According to the connector unit 2, with respect to the facing direction (length direction Y1), the actuator 20 is arranged on the leading end side in the direction from the housing 22 toward the flexible connection member 8. According to this configuration, the portion of the actuator 20 on the leading end side, which is most distant from the two shaft portions 42, is arranged at the edge portion of the housing 22 on the leading end side. As a result, even if the size of the actuator 20 is small, the worker can easily operate the actuator 20 with a finger or the like.

According to the connector unit 2, the two reinforcement tabs 23 are respectively arranged on the two end portions, in the width direction, of the housing 22, and are fixed to the mounting portion 19. According to this configuration, the two reinforcement tabs 23 do not become obstacles when the actuator 20 is displaced from the open position A1 to the closed position A2 by a finger or the like of the worker.

According to the connector unit 2, the actuator 20 is arranged in the notch portion 18 of the LED substrate 10. According to this configuration, the connector 11 is arranged so as to be side-by-side with the edge portions 18a of the notch portion 18 of the LED substrate 10. Accordingly, the protruding amount of the connector 11 from the LED substrate 10 can be reduced further. Therefore, even in the case where parts are arranged densely in the periphery of the actuator 20, it is possible to ensure a larger amount of space for operating the actuator 20.

According to the electrical connector 11, even in the state where the flexible connection member 8 is not connected to the connector 11, the actuator 20 is held at the provisional hold position A3, which is a fixed position relative to the housing 22, by the provisional holding mechanism 51. Accordingly, even in the case where the connector 11 is transported in a standalone state for example, it is possible to suppress cases where the actuator 20 unintentionally becomes displaced relative to the housing 22 due to vibration or the like. Also, engagement of the first engagement portions 52 and the second engagement portions 53 of the provisional holding mechanism 51 is prevented by insertion of the flexible connection member 8 between the housing 22 and the actuator 20. Accordingly, when the flexible connection member 8 is inserted between the housing 22 and the actuator 20, it is possible to prevent the generation of resistance force caused by engagement of the first engagement portions 52 and the second engagement portions 53. Accordingly, at this time, the actuator 20 can be more reliably displaced from the open position A1 to the closed position A2 without being obstructed by the provisional holding mechanism 51. Accordingly, the contacts 21 and the conductive portions 13 of the flexible connection member 8 can be more reliably brought into contact with each other. In other words, it is possible to suppress an incompletely locked state in which the actuator 20 has not reached the closed position A2 due to the provisional holding mechanism 51. As a result, it is possible to suppress a semi-mated state in which the state of contact between the flexible connection member 8 and the contacts 21 is unstable.

According to the connector 11, the second engagement portions 53 are arranged on the base end portion 20a of the actuator 20. According to this configuration, the space needed for swinging of the actuator 20 in the periphery of the two shaft portions 42 can be used as space for the provisional holding mechanism 51. Accordingly, the size of the connector 11 can be further reduced through effective utilization of the space in the periphery of the two shaft portions 42.

According to the connector 11, the first engagement portions 52 can be formed by flat surfaces. Accordingly, it is possible to further simplify the configuration of the provisional holding mechanism 51.

According to the connector 11, by inserting the flexible connection member 8 between the housing 22 and the actuator 20, the actuator 20 undergoes elastic deformation, and therefore the second engagement portions 53 move away from the first engagement portions 52. According to this configuration, by performing the operation of inserting the flexible connection member 8 between the housing 22 and the actuator 20, that is to say the operation of connecting the flexible connection member 8 to the connector 11, it is possible to disengage the first engagement portions 52 and the second engagement portions 53. Accordingly, there is no need for a dedicated operation for disengaging the first engagement portions 52 and the second engagement portions 53. Therefore, it is possible to more easily perform operations to connect the connector 11 to the flexible connection member 8 from the state where the actuator 20 is provisionally held by the provisional holding mechanism 51.

Next, a second embodiment of the present invention will be described. Note that the following mainly describes differences from the first embodiment, and configurations similar to the first embodiment will not be described in some cases.

Figure 18:
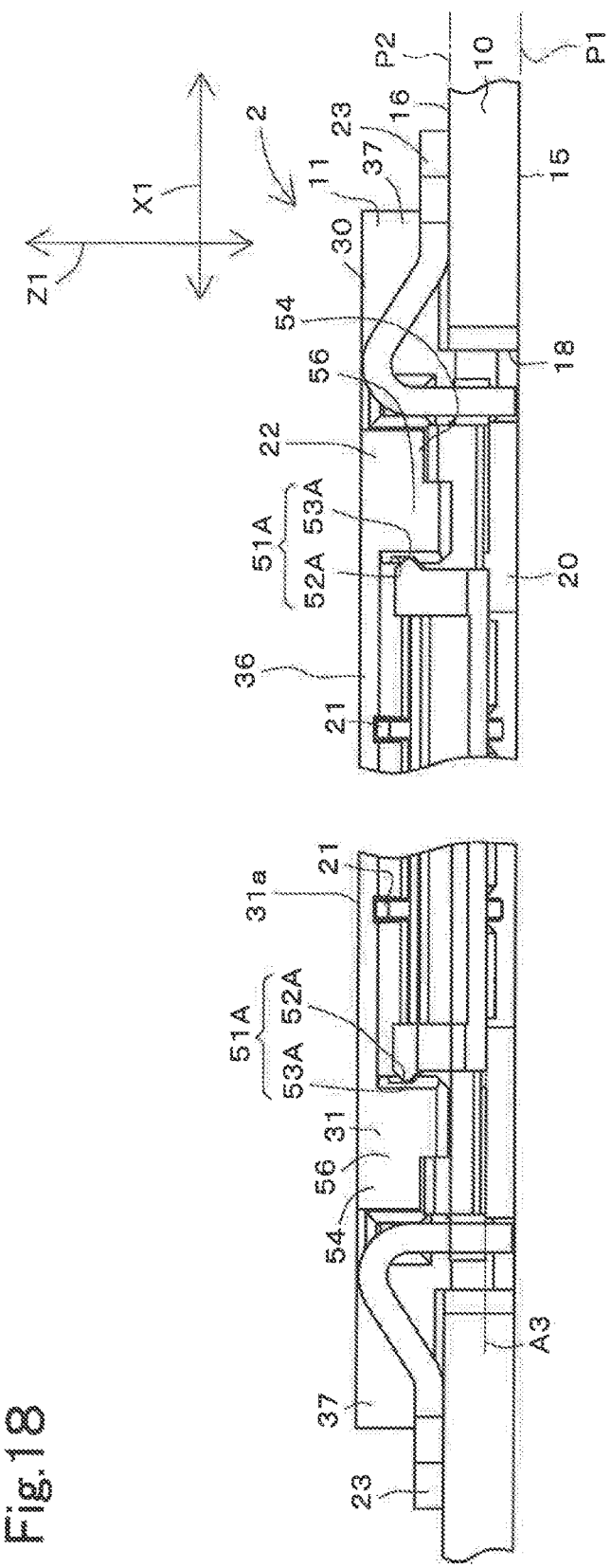
FIG. 18 is a front view of a connector unit according to a second embodiment, and shows a state where an actuator is held at a provisional hold position.
Figure 19:
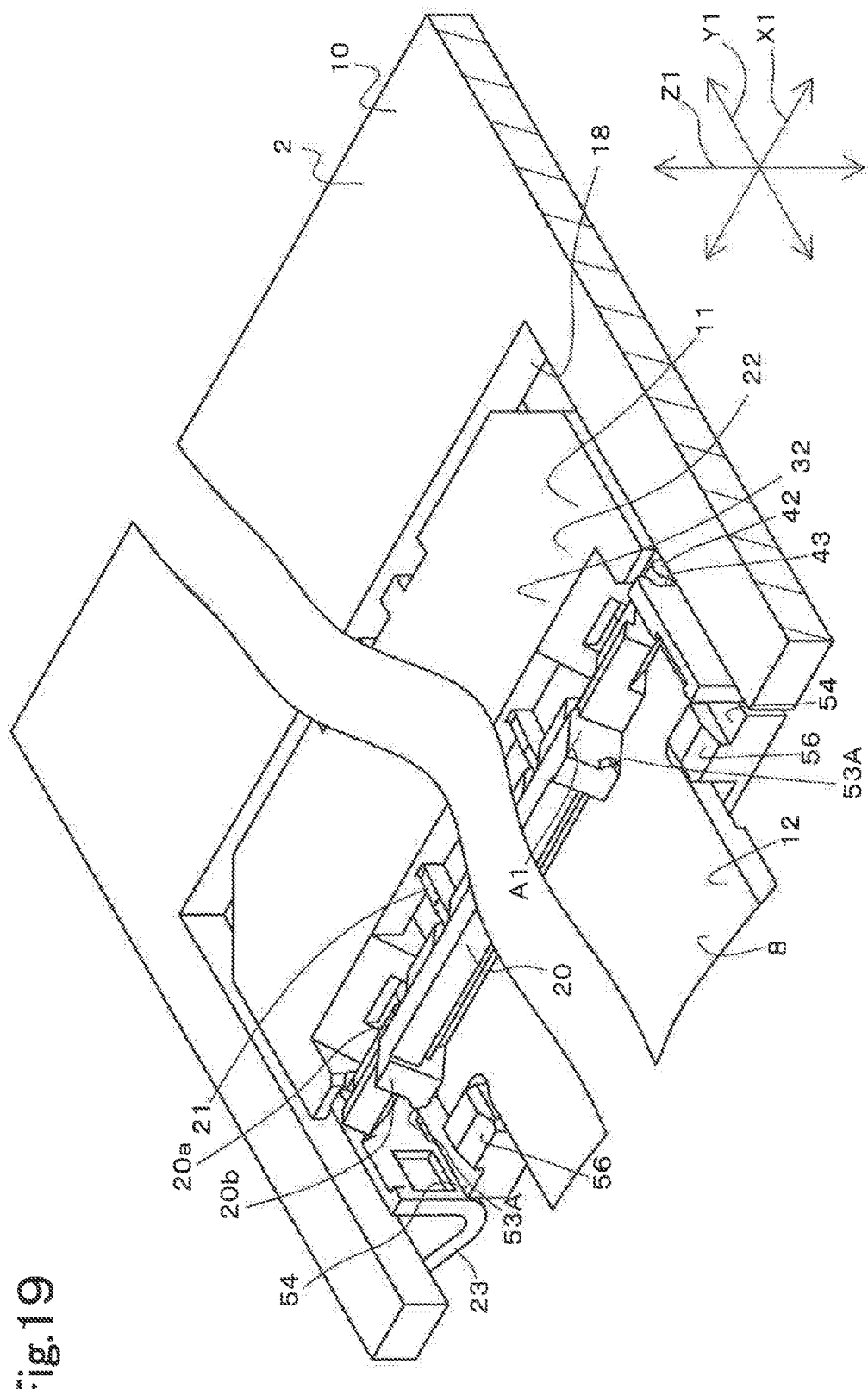
FIG. 19 is a perspective view of the connector unit according to the second embodiment, and shows a state where the actuator is held at the open position.
Figure 20:
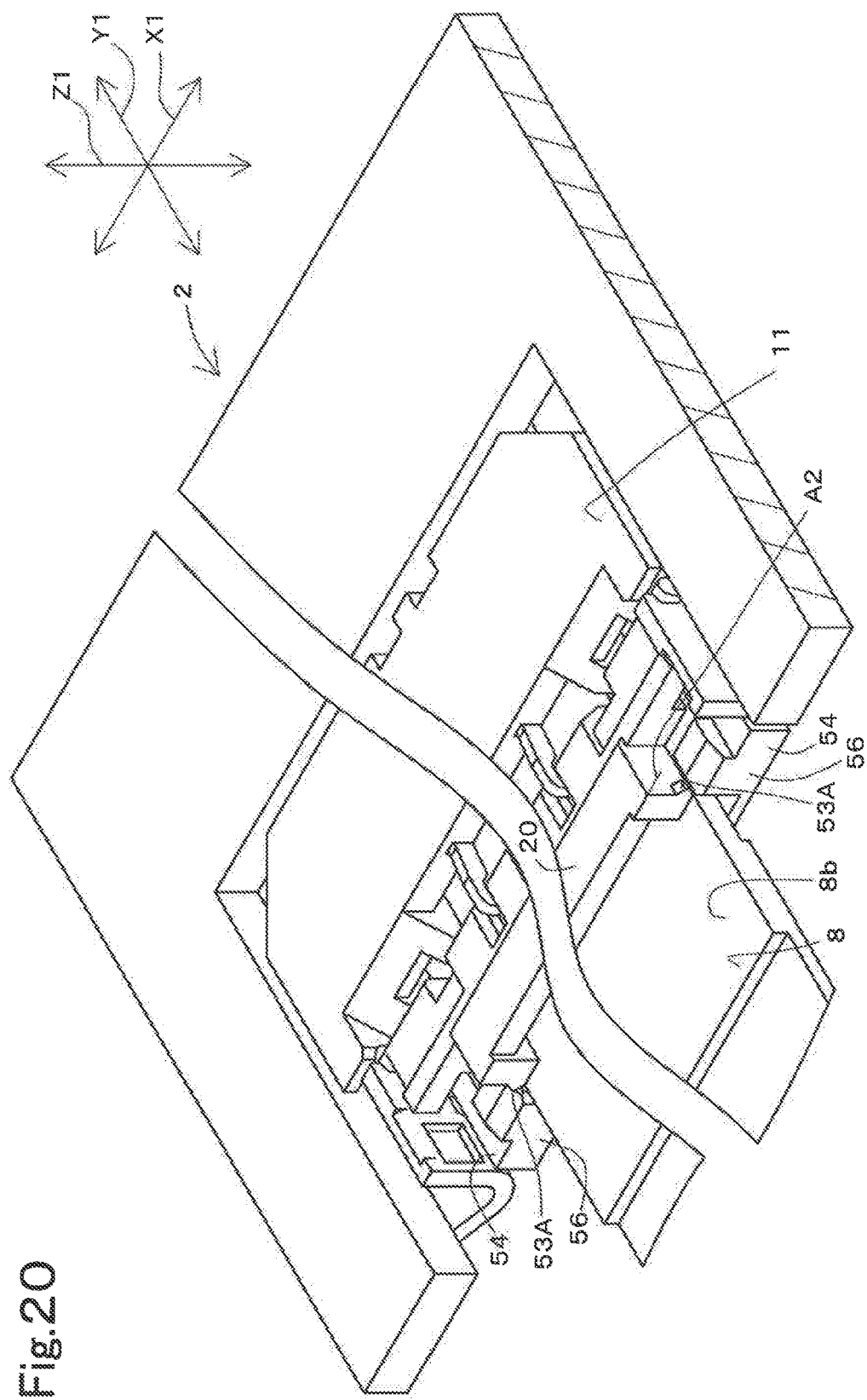
FIG. 20 is a perspective view of the connector unit according to the second embodiment, and shows a state where the actuator is held at the closed position.

FIG. 18 is a front view of the connector unit 2 according to the second embodiment, and shows a state where the actuator 20 is held at the provisional hold position A3. FIG. 19 is a perspective view of the connector unit 2 according to the second embodiment, and shows a state where the actuator 20 is held at the open position A1. FIG. 20 is a perspective view of the connector unit 2 according to the second embodiment, and shows a state where the actuator 20 is held at the closed position A2.

As shown in FIGS. 18 to 20, the connector 11 of the connector unit 2 has a provisional holding mechanism 51A instead of the provisional holding mechanism 51. The provisional holding mechanism 51A has first engagement portions 52A that are provided on at least one of the housing 22 and a member fixed to the housing 22, and second engagement portions 53A that are provided on the actuator 20 and are engaged with the first engagement portion 52A at the provisional hold position A3. In this configuration, engagement of the first engagement portions 52A and the second engagement portions 53A is prevented by insertion of the flexible connection member 8 between the bottom wall portion 31 of the housing 22 and the actuator 20.

The first engagement portions 52A constitute a portion of the housing 22. The first engagement portions 52A are arranged avoiding a region of the housing 22 through which the flexible connection member 8 passes. Specifically, the first engagement portions 52A are provided in the two retaining portions 56 of the housing 22. In the present embodiment, the pair of first engagement portions 52A respectively have receding portions that are formed in the inward surfaces of the pair of retaining portions 56 that face each other. Accordingly, the two first engagement portions 52A are respectively arranged on two end portions of the bottom wall main body 36 in the width direction X1. The two first engagement portions 52A face the passing portion, through which the flexible connection member 8 passes, in the width direction X1. Accordingly, when the flexible connection member 8 is inserted between the bottom wall portion 31 of the housing 22 and the actuator 20, the pair of first engagement portions 52A are blocked by the flexible connection member 8, thus being prevented from engaging with the pair of second engagement portions 53A.

The two second engagement portions 53A are formed integrally with the actuator 20. In the present embodiment, the two second engagement portions 53A are formed by protruding portions (protrusion-shaped portions). The two second engagement portions 53A are provided on the leading end portion 20b of the actuator 20. In the present embodiment, the two second engagement portions 53A are respectively arranged on two end portions of the actuator 20 in the width direction X1, and are shaped as small pieces that protrude in the width direction X1 from the outward surface of the actuator 20 in the width direction X1. In the present embodiment, when the actuator 20 is at the provisional hold position A3, the leading end portion 20b is located near a bottom surface 31a of the bottom wall portion 31 than when the actuator 20 is at the closed position A2.

The outward surfaces of the two second engagement portions 53A are shaped as mountains that protrude outward in the width direction X1 in a plan view of the actuator 20. Accordingly, the two second engagement portions 53A smoothly engage with and disengage from the corresponding first engagement portions 52A.

According to the above configuration, in the present embodiment, the open position A1, the closed position A2, and the provisional hold position A3 are set at positions about the two shaft portions 42 in the order of the open position A1, the closed position A2, and then the provisional hold position A3.

In the state before connection of the connector 11 to the flexible connection member 8, as shown in FIG. 18, the actuator 20 is arranged at the provisional hold position A3. At this time, as previously described, the actuator 20 is held at the provisional hold position A3 by engagement of the two first engagement portions 52A and the two second engagement portions 53A of the provisional holding mechanism 51A.

Next, the worker displaces the actuator 20 about the two shaft portions 42, thus displacing the actuator 20 from the provisional hold position A3 to the open position A1 as shown in FIG. 19. Next, similarly to the description given in the first embodiment, the flexible connection member 8 is inserted between the bottom wall main body 36 of the housing 22 and the actuator 20, and then the actuator 20 is displaced to the closed position A2 as shown in FIG. 20. Accordingly, the flexible connection member 8 is connected to the connector 11.

As described above, in the second embodiment, the two second engagement portions 53A of the provisional holding mechanism 51A are arranged on the leading end portion 20b of the actuator 20. Accordingly, the worker or the like can easily touch the periphery of the two second engagement portions 53A. It is therefore possible to more easily perform the operation of removing the two second engagement portions 53A from the two first engagement portions 52A.

In the second embodiment, the open position A1, the closed position A2, and the provisional hold position A3 are set at positions about the two shaft portions 42 in the order of the open position A1, the closed position A2, and then the provisional hold position A3. According to this configuration, when the actuator 20 is held at the provisional hold position A3, such as when the connector 11 is transported in a standalone state, the actuator 20 can be held at a position at which the leading end portion 20b of the actuator 20 is receded relative to the housing 22. Accordingly, it is possible to easily visually recognize that the actuator 20 is provisionally held.

Although embodiments of the present invention have been described above, the present invention is not limited to the above embodiments, and various modifications can be made without departing from the recitation of the claims. For example modifications such as the following may be carried out.

Figure 21:
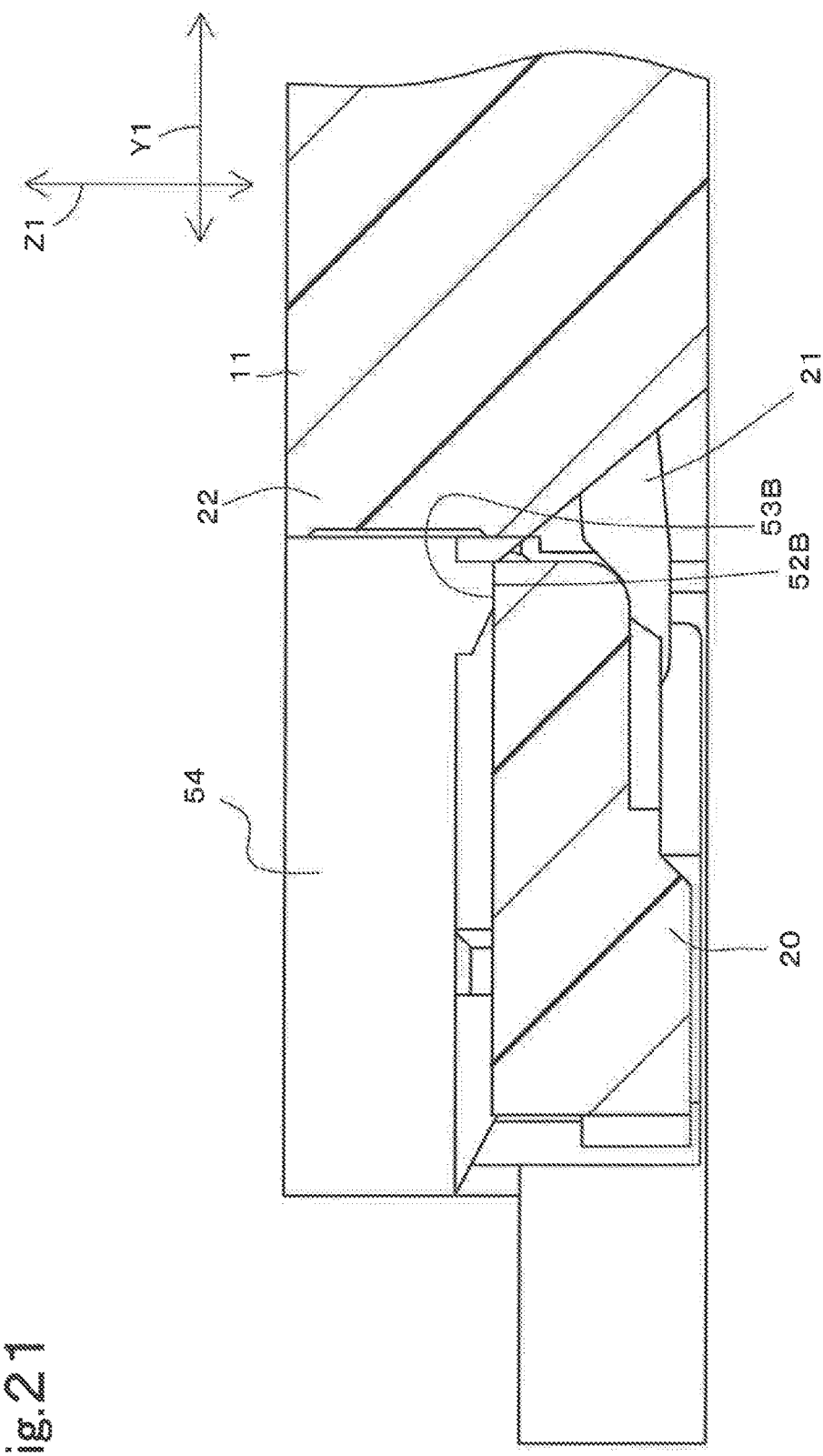
FIG. 21 is a diagram showing main portions of a variation.

(1) For example, in the first embodiment, an example is described in which the first engagement portions 52 are flat portions, and the second engagement portions 53 are protruding portions. However, there is no limitation to this. For example, as shown in FIG. 21, a configuration is possible in which first engagement portions 52B are protruding portions, and second engagement portions 53B are flat portions. In this case, the two first engagement portions 52B are protrusions formed on the upper end surface of the fencing portions 54, and the two second engagement portions 53B are flat portions formed on portions of the actuator 20 that face the two first engagement portions 52B.

(2) In the first embodiment, an example is described in which the first engagement portions 52 are formed on the housing 22. However, there is no limitation to this. For example, as shown in FIG. 22, first engagement portions 52C may be formed on the two reinforcement tabs 23. In this case, the first engagement portions 52 are formed by inward surfaces of the first fixing portions 45 of the two reinforcement tabs 23. Also, second engagement portions 53C of the actuator 20 are formed by protruding portions that project toward the first engagement portions 52C side. Note that in this case, a configuration is possible in which the first engagement portions 52C are shaped as protrusions, and the second engagement portions 53 are formed by flat surfaces.

(3) In the second embodiment, a configuration is possible in which the first engagement portions are protruding portions formed on the retaining portions 56 of the housing 22, and the second engagement portions are receding portions formed in the actuator 20.

(4) In the above embodiments, examples are described in which the two reinforcement tabs 23 are provided with the hole portions 43 for the two shaft portions 42 of the actuator 20. However, there is no limitation to this. For example, hole portions for fitting of the two shaft portions 42 may be formed in the housing 22 itself.

(5) In the above embodiments, examples are described in which the electrical connector 11 and the electrical connector unit 2 that includes the electrical connector 11 are applied to the liquid crystal display device 1, but there is no limitation to this. The electrical connector 11 and the electrical connector unit 2 that includes the electrical connector 11 may be applied to a device other than a liquid crystal display device.

INDUSTRIAL APPLICABILITY

The present invention is broadly applicable as a substrate connection structure.

DESCRIPTIONS OF REFERENCE NUMERALS

2 Electrical connector unit (substrate connection structure)
8 Flexible connection member (partner connection member)
10 LED substrate (substrate)
10a One edge portion of LED substrate
11 Electrical connector
13 Conductive portion
15 First surface
16 Second surface
18 Notch portion
18a Edge portion
19 Mounting portion
20 Actuator
21 Contact
22 Housing
23 Reinforcement tab
24 First contact portion
25 Second contact portion
26 Joining portion
27 First portion
28 Second portion
28a Bent portion
28b Second portion main body
28c, 28d Arm portion
36 Bottom wall main body
37 Support portion
42 Shaft portion
43 Hole portion
45 First fixing portion
46 Extension portion
47 Second fixing portion
A1 Open position
A2 Closed position
X1 Width direction
Y1 Length direction
Z1 Thickness direction

The invention claimed is:

1. A substrate connection structure having a substrate and an electrical connector,
the substrate including a notch portion formed in one edge portion of the substrate, and a mounting portion formed in a periphery of the notch portion, the electrical connector being mounted on the mounting portion,
the mounting portion having a first surface and a second surface that are parallel to each other,
the electrical connector including a housing, a contact held in the housing and capable of coming into contact with a predetermined partner connection member, and a reinforcement tab attached to the housing,
the housing including a bottom wall main body arranged in a periphery of the notch portion, and a support portion arranged at an end portion of the bottom wall main body in a width direction of the electrical connector and supported by the second surface, and
the reinforcement tab including a first fixing portion fixed to the bottom wall main body, an extension portion extending from the first fixing portion so as to move away from the first fixing portion along the width direction, and a second fixing portion formed at a leading end of the extension portion, arranged side-by-side with the support portion in a length direction orthogonal to the width direction, and fixed to the second surface of the mounting portion,
wherein a plurality of the contacts are arranged along a predetermined width direction,
each of the contacts includes a first contact portion fixed to the second surface, a second contact portion configured to come into contact with a conductive portion of the partner connection member, and a joining portion configured to join the first contact portion and the second contact portion to each other,
the joining portion includes a first portion continuous with the first contact portion, and a second portion continuous with the second contact portion,
the first portion has a curved shape so as to move away from the second surface while extending from the first contact portion toward the one edge portion of the substrate, and spans an edge portion of the notch portion at a position separated from the second surface,
the second portion has an L-shaped bent portion that extends toward the notch portion from another end portion of the first portion on a side opposite to one end portion continuous with the first contact portion, a second portion main body continuous with the bent portion and arranged so as to pass through the notch portion, and an arm portion extending from the second portion main body, and
the second contact portion is provided in the arm portion.

* * * * *